United States Patent [19]

Funk et al.

[11] Patent Number: 5,185,419
[45] Date of Patent: Feb. 9, 1993

[54] POLY(ARYLENEVINYLENESILOXANES) COMPOUNDS

[75] Inventors: Enno Funk, Müchen; Franz-Heinrich Kreuzer, Martinsried; Cornelia Gramshammer, Pöring; Willibald Lottner, Tutzing, all of Fed. Rep. of Germany

[73] Assignee: Consortium für elektrochemische GmbH, Munich, Fed. Rep. of Germany

[21] Appl. No.: 653,385

[22] Filed: Feb. 11, 1991

[30] Foreign Application Priority Data

Feb. 16, 1990 [DE] Fed. Rep. of Germany ....... 4004944

[51] Int. Cl.[5] ............................................. C08G 77/04
[52] U.S. Cl. ........................................ 528/25; 528/15; 528/31
[58] Field of Search ................................ 528/15, 25, 31

[56] References Cited

U.S. PATENT DOCUMENTS

4,687,870  8/1987  Cavezzan ........................... 528/15
5,057,549  10/1991  Herzig et al. ....................... 528/25

OTHER PUBLICATIONS

Rochow, An Introduction to the Chemistry of the Silicones, pp. 49–50, John Wiley & Sons, Inc. NY (1946).

Primary Examiner—Melvyn I. Marquis

[57] ABSTRACT

Poly(arylenevinylenesilicon) compounds and a process for their preparation, where $\alpha,\omega$-dialkenylarylenevinylene is reacted with an organosilicon compound containing two Si-bonded hydrogen atoms, in the presence of a catalyst which promotes the addition reaction of Si-bonded hydrogen to an aliphatic multiple bond.

9 Claims, No Drawings

POLY(ARYLENEVINYLENESILOXANES) COMPOUNDS

The invention relates to poly(arylenevinylenesilicon)compound and more particularly to a process for preparing poly(arylenevinylenesilicon)compounds and their use.

BACKGROUND OF THE INVENTION

Organopolysiloxanes are of considerable interest since they have high thermooxidative stability, extreme low temperature flexibility and low temperature dependence of their physical constants. However, their mechanical properties, such as tensile strength, tear propagation strength and peel strength are usually inferior to those of organic polymers. In order to avoid this disadvantage, attempts have been made to modify organopolysiloxanes using organic compounds. These organic compounds are, in particular, compounds which contain aromatic or heterocyclic structural elements or contain functional groups, such as ester and amide radicals. Reference is made here, for example, to German Patent 14 45 357 (R. L. Merker, Dow Corning Corp.; published on Feb. 6, 1969) and R. L. Merker, M. J. Scott, G. G. Haberland, J. Polym. Sci.: Part A 2 (1964) 31, where dimethylsiloxane-phenylene copolymers are described. Copolymers containing siloxane and aliphatic and aromatic hydrocarbon blocks are disclosed in U.S. Pat. No. 3,051,684 (M. Morten and A. Rembaum, The Board of Directors of The University of Akron; published on Aug. 28, 1962) and U.S. Pat. No. 3,483,270 (E. E. Bostick, General Electric Co., published on Dec. 9, 1969), while siloxane copolymers containing aromatic ester and amide groups have been disclosed in German Patent 25 43 919 (M. Bargain, Rhône-Poulenc Ind.; published on May 27, 1987) and the corresponding U.S. Pat. No. 4,088,670 (published on May 9, 1987), U.S. Pat. No. 4,147,711 (published on Apr. 3, 1979), U.S. Pat. No. 4,213,914 (published on Jul. 23, 1980) and U.S. Pat. No. 4,275,184 (published on Jun. 23, 1981). Examples of poly(imidosiloxanes) are disclosed in H. Kuckertz, Makromol. Chem. 98 (1966) 101-8. In addition, V. Percec, J. Polym. Sci.: Part A 26 (1988) 2047-76 describes siloxane polymers containing stilbenes as side groups. Numerous attempts to modify polysiloxanes using organic compounds are known. Reference is further made in this respect to M. Wick, G. Kreis and F.-H. Kreuzer in Ullmanns Encyklopädie der technischen Chemie, (Ullmann's Encyclopedia of Industrial Chemistry), Verlag Chemie, Weinheim, 4th Edition, 1982, Vol. 21, pages 532 ff.

Therefore, it is an object of the present invention to provide thermoplastic siloxane elastomers. Another object of the present invention is to provide a process for preparing thermoplastic siloxane elastomers.

SUMMARY OF THE INVENTION

The foregoing objects and others which are apparent from the following description are accomplished in accordance with this invention, generally speaking, by providing poly(arylenevinylenesilicon compounds) containing units of the general formula

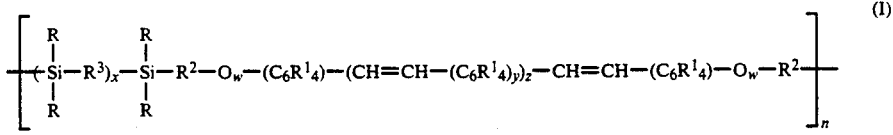

in which R may be the same or different and represents a monovalent, SiC-bonded organic radical containing no aliphatic multiple bonds or a substituted, SiC-bonded organic radical containing no aliphatic multiple bonds, $R^1$ may be the same or different and represents a hydrogen atom, halogen atom, nitro group, cyano group, monovalent organic radical containing no aliphatic multiple bonds or a substituted organic radical containing no aliphatic multiple bonds. $R^2$ may be the same or different and represents a divalent organic radical or a substituted organic radical, $R^3$ may be the same or different and represents an oxygen atom or a divalent SiC-bonded organic radical containing no aliphatic multiple bonds or a substituted, SiC-bonded organic radical containing no aliphatic multiple bonds, n is a number of from 2 to 500, preferably from 10 to 100, w is 0 or 1, preferably 1, x is a number of from 1 to 100, preferably from 2 to 50, and more preferably from 3 to 20, y is 1 or 2, and z is a number of from 1 to 3, preferably 1, with the proviso that y is 1 if z is greater than 1.

The present invention also relates to a process for preparing poly(arylenevinylenesilicon)compounds and to the use of the same.

DESCRIPTION OF THE INVENTION

The term poly(arylenevinylenesilicon) compounds is intended to include polymers which contain, siloxanes or silcarbanes as a silicon-functional unit.

Preferred radicals represented by R are hydrocarbon radicals having from 1 to 12 carbon atoms, which are optionally substituted by halogen atoms, ether groups, ester groups, epoxy groups or cyano groups.

Examples of hydrocarbon radicals represented by R are alkyl radicals, such as methyl, ethyl, n-propyl, isopropyl, 1-n-butyl, 2-n-butyl, isobutyl, tert-butyl, n-pentyl, isopentyl, neopentyl and tert-pentyl radicals, hexyl radicals, such as the n-hexyl radical, heptyl radicals, such as the n-heptyl radical, octyl radicals, such as the n-octyl radical and isooctyl radicals, such as the 2,2,4-trimethylpentyl radical, nonyl radicals, such as the n-nonyl radical, decyl radicals, such as the n-decyl radical, and dodecyl radicals, such as the n-dodecyl radical; cycloalkyl radicals, such as cyclopentyl, cyclohexyl and cycloheptyl radicals, and methylcyclohexyl radicals; aryl radicals, such as the phenyl and naphthyl radicals; alkaryl radicals, such as o-, m- and p-tolyl radicals, xylyl radicals and ethylphenyl radicals, and aralkyl radicals, such as the benzyl radical and the α- and β-phenylethyl radicals.

Examples of substituted hydrocarbon radicals represented by R are cyanoalkyl radicals, such as the β-cyanoethyl radical, and halogenated hydrocarbon radicals, for example haloalkyl radicals, such as the 3,3,3-trifluoro-n-propyl radical, the 2,2,2,2′,2′,2′-hexafluoroisopropyl radical, and the heptafluoroisopropyl radical, and haloaryl radicals, such as the o-, m- and p-chlorophenyl radicals.

Preferred radicals represented by R are the methyl, ethyl, 3,3,3-trifluoro-n-propyl and phenyl radicals.

Preferred radicals represented by $R^1$ are the hydrogen atom, halogen atom, nitro group, cyano group, alkoxy, alkoxycarbonyl and acyloxy groups and hydrocarbon radicals having from 1 to 12 carbon atoms which may optionally be substituted by halogen atoms.

Examples of radicals represented by $R^1$ are the radicals mentioned above as examples of R radicals, and alkoxy groups, such as methoxy, ethoxy or n-propyloxy groups, alkoxycarbonyl groups, such as methoxycarbonyl, ethoxycarbonyl or n-propyloxycarbonyl groups, and acyloxy groups, such as acetoxy or benzoyloxy groups.

Particularly preferred radicals represented by $R^1$ are hydrogen atoms, methyl, phenyl, methoxy, methoxycarbonyl, acetoxy and benzoyloxy groups, and fluorine and chlorine.

Preferred radicals represented by $R^2$ are divalent, and optionally substituted divalent hydrocarbon radicals having from 1 to 20 carbon atoms which may be substituted by ether oxygen atoms.

Examples of radicals represented by $R^2$ are alkylene radicals, such as the methylene, ethylene, n-propylene, isopropylene, 1-n-butylene, 2-n-butylene, isobutylene, tert-butylene, n-pentylene, isopentylene, neopentylene and tert-pentylene radicals, hexylene radicals, such as the n-hexylene radical, heptylene radicals, such as the n-heptylene radical, octylene radicals, such as the n-octylene radical, and isooctylene radicals, such as the 2,2,4-trimethylpentylene radical, nonylene radicals, such as the n-nonylene radical, decylene radicals, such as the n-decylene radical, dodecylene radicals, such as the n-dodecylene radical, and octadecylene radicals, such as the n-octadecylene radical; cycloalkylene radicals, such as cyclopentylene, cyclohexylene and cycloheptylene radicals, and methylcyclohexylene radicals.

Examples of substituted radicals represented by $R^2$ are cyanoalkylene radicals, such as the β-cyanoethylene radical, and halogenated hydrocarbon radicals, for example haloalkylene radicals, such as the 3,3,3-trifluoro-n-propylene radical, and the 2,2,2',2',2'-hexafluoroisopropylene radical, and haloarylene radicals, such as the o-, m- and p-chlorophenylene radicals.

Particularly preferred radicals represented by $R^2$ are linear alkylene radicals having from 2 to 6 carbon atoms, and more preferably the propylene and butylene radicals.

The preferred $R^3$ radicals are oxygen atoms.

However, if the $R^3$ radical is a divalent, SiC-bonded radical, then hydrocarbon radicals are preferred having from 1 to 30 carbon atom(s), which may be substituted by ether oxygen atoms, such as, for example, oligooxymethylene or oligooxyethylene groups.

The vinylene groups present in the poly(arylenevinylenesilicon)compounds of this invention may have the cis- or trans-configuration and more preferably poly(arylenevinylenesilicon)compounds containing trans-configured vinyl groups.

In the poly(arylenevinylensilicon)compounds of this invention, the arylene groups —$(C_6R^1_4)$— may be linked to the vinylene groups or the —$O_w$—$R^2$ groups where $R^1$, $R^2$ and w are the same as above, in the 1,2-(ortho-), 1,3-(meta-) or 1,4-(para-) positions relative to the vinylene or arylene groups which are also linked to the particular arylene group, in which linking via the 1,4-positions is preferred In the poly(arylenevinylenesilicon)compounds of this invention, the recurring arylenevinylenesilicon units of formula (I) may be the same or different.

Although it is not indicated in formula (I), up to 20% of the diorganosiloxane units may be replaced by $R_3SiO_{\frac{1}{2}}$, $RSiO_{3/2}$ and $SiO_{4/2}$ units, where R is the same as above.

Although it is not indicated in formula (I), up to 50% of the hydrogen atoms in the vinylene groups may be replaced by alkyl groups, and more preferably by methyl groups.

The poly(arylenevinylenesilicon)compounds of this invention can be prepared by processes which are known per se. The poly(arylenevinylenesiloxanes) of this invention are preferably prepared by reacting α,w-dialkenylarylenevinylene with an organosilicon compound containing two Si-bonded hydrogen atoms, in the presence of a catalyst which promotes the addition reaction of Si-bonded hydrogen to an aliphatic multiple bond.

The α,w-dialkenylarylenevinylenes employed in the process of this invention are preferably those of the formula $$R^4-O_w-(C_6R^1_4)-(CH=CH-(C_6R^1_4)_y)_z-CH= CH-(C_6R^1_4)-O_w-R^4, \qquad (II)$$

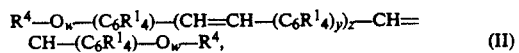

where $R^1$, w, y and z are the same as above, and $R^4$ may be the same or different and represents a monovalent, organic radical containing a terminal carbon-carbon double bond or a monovalent substituted organic radical containing a terminal carbon-carbon double bond, with the proviso that y is 1 if z is greater than 1.

The radical $R^4$ is preferably a monovalent hydrocarbon radical having from 1 to 20 carbon atoms and contains a terminal aliphatic carbon-carbon double bond or a substituted monovalent hydrocarbon radical having from 1 to 20 carbon atoms and contains a terminal aliphatic carbon-carbon double bond.

Examples of radicals represented by $R^4$ are the vinyl radical, allyl radical, n-but-3-enyl radical, n-hex-5-enyl radical, n-undec-10-enyl radical and n-undec-10-enoyl radical.

Although it is not indicated in formula (II), up to 50% of the hydrogen atoms in the vinylene groups may be replaced by alkyl groups, and more preferably by methyl groups.

Examples of α,w-dialkenylarylenevinylenes employed in the process of this invention are

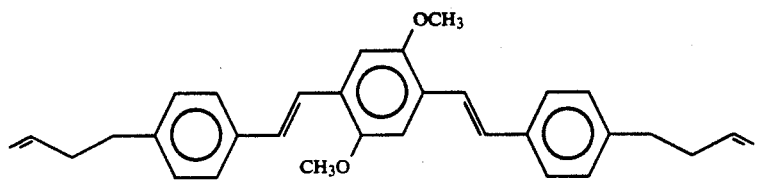

-continued
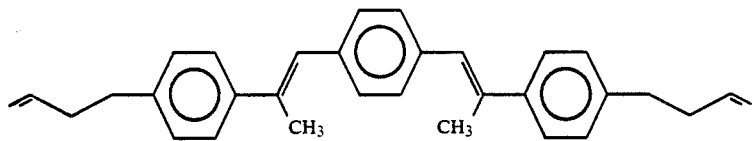
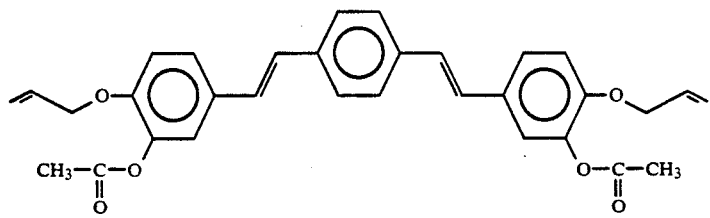
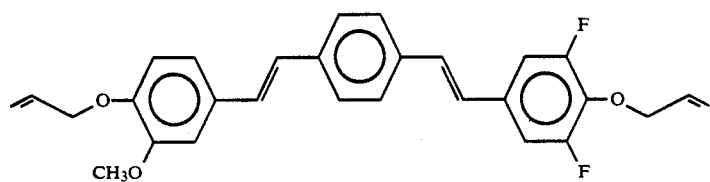
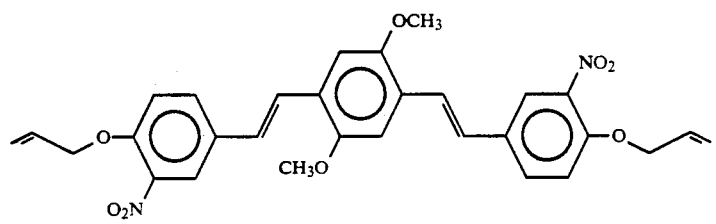
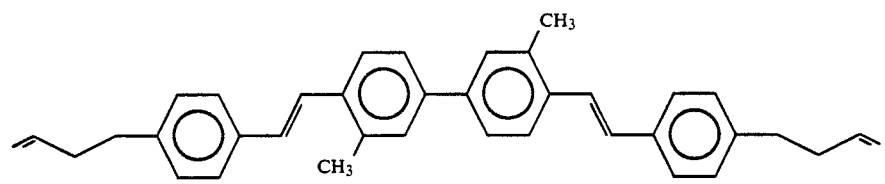
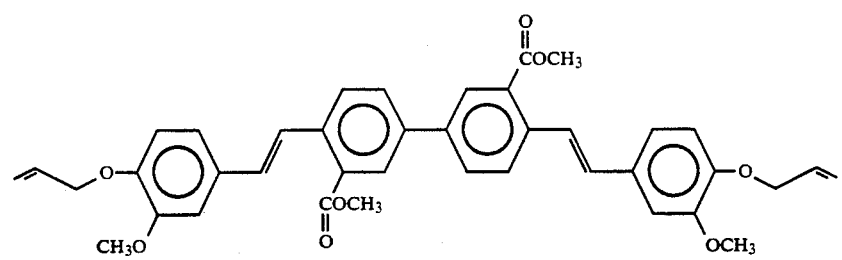
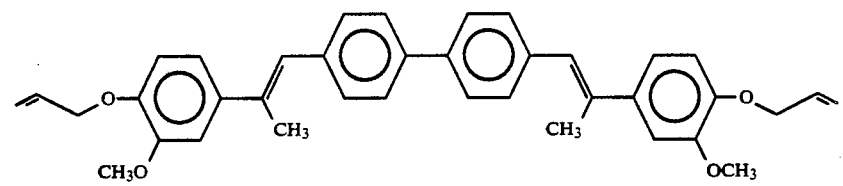
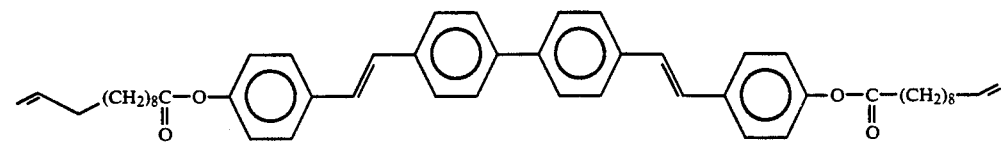

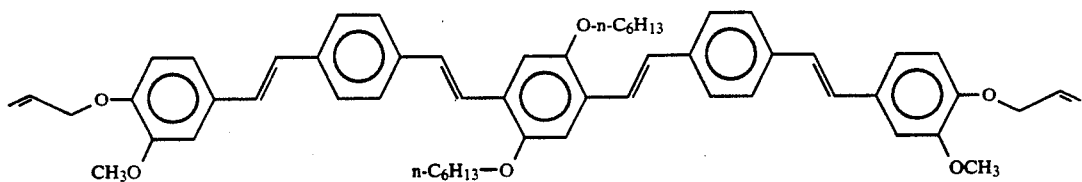

The α,w-dialkenylarylenevinylene employed in this invention may be a single type of α,w-dialkenylarylenevinylene. However, it may also be a mixture of at least two different types of these α,w-dialkenylarylenevinylenes.

The α,w-dialkenylarylenevinylenes employed in the process of this invention can be prepared by processes which are known per se. For example, α,w-dialkenylarylenevinylenes of formula (II) can be prepared by reacting phosphonates, such as, for example, those of the formula

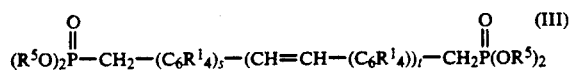

in which R¹ is the same as above, R⁵ may be the same or different and represents an alkyl radical having from 1 to 10 carbon atoms, and in particular an ethyl radical, s is 1 or 2, and t is 0, 1 or 2, with the proviso that s is 1 if t is greater than 0, with aromatic aldehydes, such as, for example, those of the formula

in which R¹, R⁴ and w are the same as above, in the presence of a base, such as, for example, potassium carbonate, potassium hydroxide, sodium hydroxide, sodium hydride, sodium methylate, potassium tert-butylate or lithium diisopropylamide, and, optionally, in the presence of a catalyst.

In the reaction of phosphonates with aldehydes, known as the Wittig-Horner-Emmons reaction, the reactant molecules are linked forming a carbon-carbon double bond, giving virtually all trans-configured double bonds.

The reaction of the phosphonate with the aldehyde in preparing the α,w-dialkenylarylenevinylene employed in the process of this invention, is advantageously carried out in a solvent which is inert to the reactants, such as, for example, aromatic hydrocarbons, such as benzene, toluene, xylene and ethylbenzene, phenol ethers, such as anisole and 1,2-dimethoxybenzene, aliphatic ethers, such as diethyl ether, tert-butyl methyl ether, 1,2-dimethoxyethane, tetrahydrofuran, dioxane, or carboxamides, such as N,N-dimethylformamide, N,N-dimethylacetamide or N-methylpyrrolidone, in which toluene, anisole and tetrahydrofuran are preferred.

In the reaction of the phosphonate with the aldehyde in the preparation of the α,w-dialkenylarylenevinylene employed in the process of this invention, two moles of aldehyde and two moles of base are preferably employed per mole of phosphonate, and when potassium carbonate is employed as the base, then three moles are preferably employed.

The reaction of the phosphonate with the aldehyde is preferably carried out at a temperature between −10° and 160° C. and at a pressure of from 900 to 3000 hPa.

The reaction of a phosphonate of formula (III) and an aldehyde of formula (IV) is more preferably carried out using potassium carbonate, potassium hydroxide or potassium tert-butylate as the base, toluene or anisole as the solvent and 18-crown-6 and potassium iodide as the catalyst.

Examples of phosphonates of formula (III) are

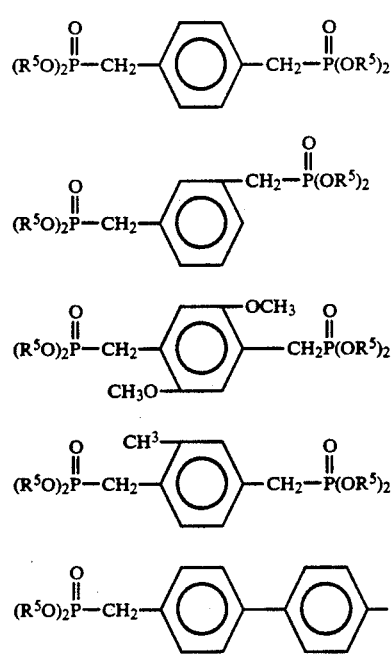

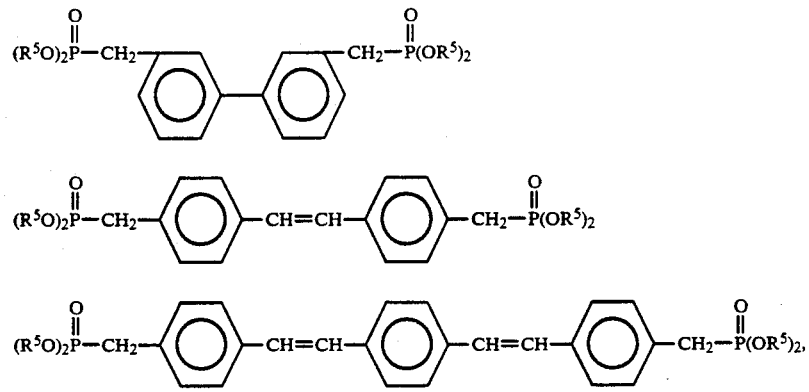

where $R^5$ is the same as above

The α,w-dialkenylarylenevinylene employed in the process of this invention is preferably prepared using the following as the phosphonate:

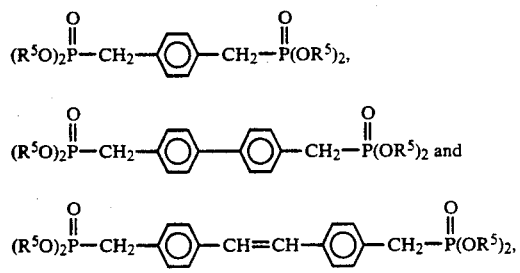

where $R^5$ is the same as above.

The phosphonates of formula (III) used in the preparation of the α,w-dialkenylarylenevinylene employed in the process of this invention can be prepared by processes which are described in the prior art. Reference is made to, for example, U.S. Pat. No. 4,371,475 (Showa Kagaku Kogyo, published on Feb. 1, 1983), U.S. Pat. No. 4,108,887 (Sandoz AG, published on Aug. 22, 1978) and GB-A 1,247,934 (K. Weber; Ciba Ltd.).

The phosphonates of formula (III) are preferably prepared from the corresponding bromine or chlorine compounds by reaction with a trialkyl phosphite, in which both the trialkyl phosphite and the bromine and chlorine compounds mentioned above are commercially available or can be prepared by methods described in organic chemistry.

In preparing the α,w-dialkenylarylenevinylene employed in the process of this invention, the aldehyde employed preferably has the formula $$CH_2=CH-(CH_2)_v-O_w-(C_6R^1_4)-CHO \quad (V)$$

where w and $R^1$ are the same as above and v is an integer of from 0 to 4.

Examples of aldehydes of formula (V) are
4-allyloxybenzaldehyde,
4-allyloxy-3-methoxybenzaldehyde,
4-(3-butenyl)benzaldehyde and
4-(10-undecenoyloxy)benzaldehyde,
in which 4-allyloxy-3-methoxybenzaldehyde and 4-(3-butenyl) benzaldehyde are especially preferred.

The aldehydes used in preparing the α,w-dialkenylarylenevinylene employed in the process of this invention, can be prepared by processes which are known per se, such as, for example, etherification of p-hydroxybenzaldehyde using appropriate alkenyl halides or tosylates. Reference is made in this respect to, for example, H. Meerwein in Houben-Weyl, "Methoden der Organischen Chemie" (Methods of Organic Chemistry), Georg Thieme Verlag, Stuttgart, 4th Edition, Vol. VI/3, 1965, pages 49–84.

Aldehydes of formula (V) are prepared for example, by a Grignard reaction of 4-alkenyl-1-chlorobenzene, which is obtained from the corresponding alkenylmagnesium chloride and 4-chlorobenzyl chloride, with N,N-dimethylformamide.

The α,w-dialkenylarylenevinylene employed in the process of this invention can also be prepared by other methods. For example, instead of the above-described reaction of phosphonate and aldehyde, the Wittig reaction of alkylenephosphines with aldehydes or, for example, reactions of Grignard reagents with aldehydes and subsequent dehydration of the resultant alcohols. Also, the palladium-catalyzed reaction of vinylaromatic compounds with haloaromatic compounds, known as the Heck reaction, may be used to prepare the α,w-dialkenylarylenevinylene employed in the process of this invention.

For example, the arylenevinylenes of formula (II) employed in the process of this invention can also be prepared by reacting phosphonates of the formula

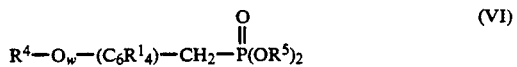

with dialdehydes of the formula

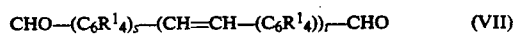

in the presence of a base and optionally in the presence of a catalyst, where $R^1$, $R^4$, $R^5$, s, t and w are the same as above, with the proviso that s is 1 if t is greater than 0. The reaction conditions in this reaction may be the same as in the above-described reaction of a phosphonate of formula (III) with an aldehyde of formula (IV), with the difference that two moles of phosphonate and two moles of base are employed per mole of aldehyde and three moles are preferably employed in the case of potassium carbonate as the base.

Preferred phosphonates of formula (VI) are
4-allyloxybenzyl phosphonate,
4-allyloxy-3-methoxybenzyl phosphonate,
4-allyloxy-3-methylbenzyl phosphonate and 4-but-3-enylbenzyl phosphonate.

The phosphonates of formula (VI) may likewise be prepared from the corresponding bromine or chlorine compounds using a trialkyl phosphite. The bromine and chlorine compounds mentioned above and the trialkyl phosphite are commercially available or can be prepared by methods known in organic chemistry.

Thus, for example, 4-butenylbenzyl chloride can be prepared from allylmagnesium chloride and 1,4-bis(chloromethyl)benzene.

Preferred dialdehydes are
terephthaldialdehyde,
4,4'-biphenyldialdehyde,
4,4'-stilbenedialdehyde and
1,4-bis(4-formylstyryl)benzene.

The dialdehydes of formula (VII) can be prepared by processes which are known per se. Reference is made to, for example, EP-A 229 592 (Ciba-Geigy AG; published on Jul. 22, 1987).

Monomeric arylenevinylenes of formula (II), in particular distyrylbenzene and bistilbene derivatives, have a broad range of applications as fluorescent dyes, for example as optical whiteners in the textile industry, and as laser dyes.

The organosilicon compound containing two Si-bonded hydrogen atoms which is employed in the process of this invention is preferably of the formula

in which R, $R^3$ and x are the same as above.

Although these are not indicated in formula (VIII), up to 20% of the diorganosiloxane units may be replaced by $R_3SiO_{\frac{1}{2}}$, $RSiO_{3/2}$ and $SiO_{4/2}$ units, where R is the same as above.

Examples of organosilicon compounds containing two Si-bonded hydrogen atoms which are employed in the process of this invention are $$H-[Si(CH_3)_2-O]_4-Si(CH_3)_2-H$$
$$H-[Si(CH_3)_2-O]_9-Si(CH_3)_2-H$$
$$H-Si(CH_3)_2-O-[Si(CH_3)(C_6H_5)-O]_{15}-Si(CH_3)_2-H$$
$$H-Si(CH_3)_2-O-[Si(CH_3)(C_8H_{17})-O]_{18}-Si(CH_3)_2-H$$
$$H-Si(CH_3)_2-O-[Si(C_2H_5)_2-O]_{10}-Si(CH_3)_2-H$$
$$H-Si(CH_3)_2O\{[Si(CH_3)_2O][Si(CH_3)(C_6H_5)O]\}_8-Si(CH_3)_2H$$

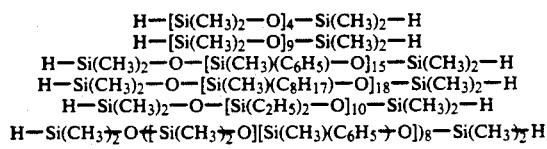

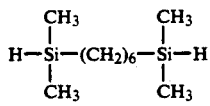

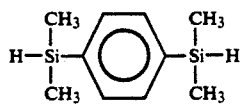

where $CH_3$ represents the methyl radical, $C_2H_5$ represents the ethyl radical, $C_6H_5$ represents the phenyl radical and $C_8H_{17}$ represents the isooctyl radical.

The viscosity of the organosilicon compound containing two Si-bonded hydrogen atoms which is employed in the process of this invention is preferably between 0.7 and 200 mm$^2$/s, and more preferably between 1 and 50 mm$^2$/s.

In the process of this invention, the organosilicon compound containing two Si-bonded hydrogen atoms is particularly preferred, such as, an α,w-dihydrogendiorgano(poly) siloxane, and in particular an α,w-dihydrogendiorgano(poly) siloxane, having from 3 to 20 silicon atoms.

The organosilicon compounds containing two Si-bonded hydrogen atoms which are employed in this invention are commercially available products or can be prepared by methods known in silicon chemistry. Reference is made, for example, to W. Noll, "Chemistry and Technology of Silicones", Academic Press, Orlando, 1968, pages 191 ff., and M. Wick, G. Kreis, F.-H. Kreuzer, "Silicone" [Silicones], in "Ullmanns Encyklopädie der technischen Chemie" [Ullmann's Encyclopedia of Industrial Chemistry], Verlag Chemie, Weinheim, 4th Edition, 1982, Vol. 21, pages 551 ff.

Longer-chain α,w-dihydrogendiorgano(poly)siloxanes can be prepared by cohydrolysis of chlorodiorganosiloxanes and dichlorodiorganosiloxanes, by cationic polymerization of octaorganocyclotetrasiloxanes in the presence of 1,3-dihydrogentetraalkyldisiloxane or by equilibration of long-chain OH-terminated diorganopolysiloxanes, or octaorganocyclotetrasiloxanes, using 1,3-dihydrogentetraalkyldisiloxane in the presence of acidic catalysts, such as PNCl$_2$, or acidic ion exchangers, such as Amberlyst 15 or Amberlyst XN-1010 (in each case in the anhydrous form).

The organosilicon compound containing two Si-bonded hydrogen atoms which is employed in this invention may be a single type of organosilicon compound containing two Si-bonded hydrogen atoms. However, it may also be a mixture of at least two different types of these organosilicon compounds.

In the process of this invention, the molar ratio between the α,w-dialkenylarylenevinylene and the organosilicon compound containing two Si-bonded hydrogen atoms in the reaction mixture is preferably between 1:0.7 and 1:1.3, and more preferably 1:1. If the molar ratio between the α,w-dialkenylarylenevinylene and the organosilicon compound containing two Si-bonded hydrogen atoms deviates significantly from 1:1, such as, for example, 1:0.7 or 1:1 3, so-called prepolymers are obtained which contain, as end groups, the component employed in excess.

In the process of this invention, the catalysts employed may be the same as those employed heretofore for the addition reaction of Si-bonded hydrogen atoms with aliphatic multiple bonds. These are principally metals from sub-group VIII and inorganic and organic compounds thereof, with platinum and compounds thereof being preferred.

Examples of such catalysts are finely divided elements or platinum deposited on an inert support, such as activated charcoal, SiO$_2$, or Al$_2$O$_3$, as in U.S. Pat. No. 2,970,150 (D. L. Bailey, Union Carbide Corporation; published on Jan. 31, 1961), hexachloroplatinic acid as in U.S. Pat. No. 2,823,218 (J. L. Speier, Dow Corning Corporation; published on Feb. 11, 1958) and chloroplatinates derived therefrom, platinum complexes of the L.PtCl$_2$ type, where L represents a linear or cyclic monoolefin, such as ethene, propene and cyclohexene, as in U.S. Pat. No. 3,159,601 and U.S. Pat. No. 3,159,662 (Bruce A. Ashby, General Electric Company; both published on Dec. 1, 1964), platinum complexes of the L.PtCl$_2$ type, where L represents a cyclic diolefin, such as 1,5-cyclooctadiene, norbornadiene and cyclopentadiene, as in JP-A2-79/76,529 and JP-A2-79/76,530 (Masatoshi Arai, Shin-Etsu Chemical Industry Co., Ltd.; both published on Jun. 19, 1979) and U.S. Pat. No, 4,276,252 (G. Kreis, Wacker-Chemie GmbH, published on Jun. 30, 1981) or represents a cyclic polyolefin, as in the German application with the file reference P 39 06 514.6 (G. Wenski, Consortium für elektrochemische Industrie GmbH; filed on Mar. 1, 1989), platinum vinylsiloxane complexes, as in U.S. Pat. No. 3,814,730 (B. D. Karstedt, General Electric Company; published on Jun. 4, 1974), and acetylacetonate complexes of platinum, as in U.S. Pat. No, 4,177,341 (G. Kreis, Consortium für elektrochemische Industrie GmbH; published on Dec. 4, 1979).

In the process of this invention, platinum complexes of the L PtCl$_2$ type, where L represents a cyclic diolefin or polyolefin are employed, because of their high effectiveness and more particularly dicyclopentadienylplatinum dichloride is preferably employed.

The catalyst employed in the process of this invention may be a single type of catalyst or a mixture of two different types of catalysts.

The amounts of catalyst employed in the process of this invention may be the same as in the processes known heretofore for the addition reaction of Si-bonded hydrogen to an aliphatic multiple bond in the presence of a catalyst. These are preferably from 0.1 to 1000 ppm by weight, and more preferably from 5 to 150 ppm by weight, calculated as elemental platinum, and based on the total weight of the reaction mixture. In the case of platinum complexes of the L PtCl$_2$ type, where L represents a cyclic diolefin or polyolefin, and in particular dicyclopentadienylplatinum dichloride, as catalysts, concentrations of between 20 and 100 ppm by weight, calculated as elemental platinum, and based on the total weight of the reaction mixture, are sufficient.

The process of this invention can be carried out in the presence or absence of solvents, where the term solvent does not indicate that all the reaction components are necessarily dissolved therein. The reaction may also be carried out in an emulsion or suspension of one or more reactants.

In the process of this invention, it is preferred that an organic solvent be used which is inert towards the reaction mixture, and in particular is a solvent in which at least some, and preferably all, of the poly(arylenevinylenesiloxanes) of this invention dissolves.

Examples of solvents are alcohols, such as methanol, ethanol, n-propanol, isopropanol, n-, sec- and tert-butanol and 2-butanol; esters, such as methyl acetate, ethyl acetate, n- and iso-propyl acetate, n-, sec- and tert-butyl acetate, ethyl formate and diethyl carbonate; ethers, such as dioxane, tetrahydrofuran, diethyl ether, di-n-propyl ether, diisopropyl ether, di-n-butyl ether, 1,2-dimethoxybenzene and anisole; chlorinated hydrocarbons, such as dichloromethane, trichloromethane, tetrachloromethane, 1,2-dichloroethane, 1,1,1-trichloroethane, trichloroethylene, tetrachloroethylene and chlorobenzene; hydrocarbons, such as pentane, n-hexane, hexane isomer mixtures, cyclohexane, heptane, octane, ligroin, petroleum ether, benzene, ethylbenzene, toluene, xylenes, and ketones, such as acetone, methyl ethyl ketone and methyl isobutyl ketone, or mixtures of these solvents, toluene, anisole, chlorobenzene, methyl 4-methylbenzoate, methyl 3-chlorobenzoate and dimethylphthalate, in which toluene and anisole, are the preferred solvents.

In the process of this invention, the solvent is employed in amounts of preferably from 20 to 99% by weight, and more preferably from 50 to 95% by weight, based on the total weight of the reaction mixture.

The temperatures and pressures used in the process of this invention may be the same as those used in processes known heretofore for the addition reaction of Si-bonded hydrogen to an aliphatic multiple bond in the presence of a catalyst. These are preferably temperatures between 0° and 180° C. and pressures between 900 and 1100 hPa, in which temperatures between 80° and 150° C. are preferred. If desired, it is also possible to use higher or lower pressures.

In the process of this invention, the $\alpha,w$-dialkenylarylenevinylene, the organosilicon compound containing two Si-bonded hydrogen atoms, catalyst and solvent, if employed, are mixed in any manner which is known per se.

It is of course also possible for the reaction mixture in the process of this invention for preparing poly(arylenevinylenesilicon) to contain, in addition to the $\alpha,w$-dialkenylarylenevinylene, the organosilicon compound containing two Si-bonded hydrogen atoms, the catalyst and solvent, if employed, additional substances, such as, for example, agents which delay the addition reaction of Si-bonded hydrogen to an aliphatic multiple bond, chain-terminating agents and cross-linking agents.

Examples of agents which delay the addition reaction of Si-bonded hydrogen to an aliphatic multiple bond are benzotriazole and 2-methyl-3-butyn-2-ol.

Examples of chain-terminating agents are compounds containing an Si-bonded hydrogen atom, such as trimethylsilane, triethylsilane and diethylmethylsilane, and compounds containing an aliphatic carbon-carbon multiple bonds, such as trimethylvinylsilane, triethylvinylsilane, styrene, allylbenzene and N-allyphthalimide.

Examples of crosslinking agents are trifunctional compounds, such as triallyl isocyanurate, glycerol triallyl ether, 1,3,5-triallylbenzyl tricarboxylate and 1,3,5-triallylbenzene, and polyfunctional compounds, such as linear or cyclic methylvinyl- or methylhydrogen(poly)siloxanes, which in addition to the methylvinyl- or methylhydrogensiloxane units may also contain dimethylsiloxane units.

The process of this invention can be carried out continuously, semicontinuously or batchwise. In a preferred procedure, one reactant, for example the organosilicon compound containing two Si-bonded hydrogen atoms, optionally, mixed with a solvent, is added dropwise with stirring to a mixture containing the other reactant, such as, for example, a mixture of an $\alpha,w$-dialkenylarylenevinylene, a catalyst and, optionally, a solvent and additional components.

On completion of the reaction according to this invention of an $\alpha,w$-dialkenylarylenevinylene with an organosilicon compound containing two Si-bonded hydrogen atoms in the presence of a catalyst which promotes the addition reaction of Si-bonded hydrogen to an aliphatic multiple bond, the reaction mixture is worked up by methods which are known per se, such as, for example, by distillation, filtration or reprecipitation. The poly(arylenevinylenesilicon) of this invention are obtained in a yield of generally more than 70%, based on the $\alpha,w$-dialkenylarylenevinylene and the organosilicon compound containing two Si-bonded atoms.

The poly(arylenevinylenesilicon) prepared by the process of this invention preferably have an average molecular weight (weight average) $M_w$ of between 5,000 and 500,000, and more preferably between 15,000 and 150,000. The siloxane proportion, i.e. the proportion by weight of the organosilicon compound in the poly(arylenevinylenesilicon) prepared according to this invention, is preferably between 20 and 95% by weight, and more preferably between 35 and 80% by weight.

The poly(arylenevinylenesilicon) of this invention have a stable fluorescent inherent color and the thermoplastic elastomers have very good mechanical properties. In addition, the poly(arylenevinylenesilicon) of this invention are distinguished by very high thermooxidative stability.

With a few exceptions, almost all poly(arylenevinylenesilicon), and in particular those containing trans-configured vinylene groups and have siloxane proportions of from 35 to 80% by weight, exhibit liquid-crystalline behavior, in which the mesophases of the poly(arylenevinylenesilicon) generally extend over broad temperature ranges. The clear point and the glass transition point are generally lower the higher the siloxane proportion.

There are numerous possible applications for the poly(arylenevinylenesilicon) of this invention. They are suitable, for example, for preparing molding materials by using methods which are used for processing thermoplastics, such as injection molding or extrusion.

In accordance with a particular application, conventional additives, such as fillers, pigments, processing assistants and antifluorescence agents, can be added to the poly(arylenevinylenesilicon) of this invention. In addition, the poly(arylenevinylenesilicon) of this invention may be added to other polymers in order to provide them with fluorescence properties.

Furthermore, the poly(arylenevinylenesiloxanes) of this invention, may be crosslinked to give thermosets. Thus, for example, the poly(arylenevinylenesiloxanes) of this invention, and more preferably those of formula (I) where $R^1$ is a hydrogen atom and y is 1, can be crosslinked relatively easy by photochemical (2+2)-cycloaddition if they are irradiated in the range of their absorption band. The thermosets obtained are generally colorless and transparent and have very good mechanical properties.

The poly(arylenevinylenesilicon) of this invention may also be employed in the field of optical information storage and for laser-optical applications such as, for example, for the storage of holograms. In addition, the poly(arylenevinylenesilicon) of this invention can be used for high-resolution photoresist materials.

In the following examples, all parts and percentages are by weight, unless otherwise specified. Unless otherwise specified, the following examples are carried out at the pressure of the ambient atmosphere, i.e., at about 1000 hPa, and at room temperature, i.e., at about 23° C., or at a temperature which is achieved without additional heating or cooling when the reactants are combined at room temperature.

The average molecular weight $M_w$ and the average degree of polymerization $P_w$ were determined by gel permeation chromatography relative to a polystyrene standard using a high-pressure liquid chromatograph with polystyrene gel columns and tetrahydrofuran as the eluent.

The intrinsic viscosities were measured using an Ubbelohde capillary viscosimeter at a temperature of 25° C. in tetrahydrofuran at concentrations of C=0.2 g/dl (1 dl=100 cm$^3$). The intrinsic viscosity $\eta_{intr}$ is defined by the equation $\eta_{intr} = 1\ n\ \eta_{rel}/C$, where the relative viscosity $\eta_{rel}$ is the quotient between the run times of the polymer solution and of the pure solvent in the capillary viscosimeter.

Thermoanalytic measurements were carried out at a heating rate of 10°/min. The glass transition point $T_g$ and the clear point $T_i$ were taken from the second run of the differential thermoanalysis (DTA) curve and the decomposition temperature—5% weight loss—from the thermogravimetry (TG) curve.

The interlayer separation d was determined by low-angle X-ray diffraction experiments.

Preparation of α,w-dihydrogendimethyl(poly)siloxanes (A) About 1250 ml (6.98 mol) of 1,3-dihydrogentetramethyldisiloxane (commercially available under the name "HSi2" from Wacker-Chemie GmbH, D-8000 Munich) are introduced into a 5 liter narrow-neck flask, and 1875 g α,w-dihydroxydimethylpolysiloxane (commercially available from ABCR GmbH & Co., D-7500 Karlsruhe 21, under the name "polydimethylsiloxane, silanol-terminated, PS 345.5") are added in portions with stirring. About 25.1 ml of a PNCl$_2$ solution (15% in CHCl$_3$; commercially available from Aldrich-Chemie GmbH & Co. KG, D-7924 Steinheim, under the name "phosphonitrilic chloride trimer") and thereafter another 938 g of the α,w-dihydroxydimethylpolysiloxane, described above, are added to the mixture. The resultant mixture is stirred until homogenation is complete (about 6 hours), then washed with a total of 6 liters of water, dried over sodium sulfate and distilled in vacuo.

The following fractions are obtained, the pressure belonging to each boiling point (b.p.) being given in mm Hg.

1st Fraction: b.p. 105°–110° C./94 mm Hg
  205.3 g of α,w-dihydrogenoctamethyltetrasiloxane (55%) and octamethylcyclotetrasiloxane (44%)

2nd Fraction: b.p. 120.5°–123.5° C./48 mm Hg
  110.1 g of α,w-dihydrogendecamethylpentasiloxane (67%) and decamethylcyclopentasiloxane (33%)

3rd Fraction: b.p. 100° C./18 mm Hg
  55.0 g of α,w-dihydrogendecamethylpentasiloxane (73%) and decamethylcyclopentasiloxane (27%)

4th Fraction: b.p. 108.5°–109.5° C./7 mm Hg
  130.5 g α,w-dihydrogendodecamethylhexasiloxane 92.4%) and dodecamethylcyclohexasiloxane (7.6%)

5th Fraction: b.p. 130.5°–145° C./7 mm Hg
  116 g g of α,w-dihydrogentetradecamethylheptasiloxane (87%) and tetradecamethylcycloheptasiloxane (13%)

6th Fraction: b.p. 145°–154° C./7 mm Hg
  166 g of α,w-dihydrogenhexadecamethyloctasiloxane 7th Fraction: b.p. 170° C./7 mm Hg
  121 g of α,w-dihydrogenoctadecamethylnonasiloxane 8th Fraction b.p. 136°–139° C./0.01 mm Hg
  100.5 g of α,w-dihydrogeneicosamethyldecasiloxane 9th Fraction: b.p. 150° C./0.01 mm Hg
  113.1 g of α,w-dihydrogendocosamethylundecasiloxane 10th Fraction: b.p. 163° C./0.05 mm Hg
  96.7 g of α,w-dihydrogentetracosamethyldodecasiloxane (B) About 92.5 g (0.31 mol) of octamethylcyclotetrasiloxane (commercially available from Aldrich-Chemie GmbH & Co. KG, D-7924 Steinheim) and 20.9 g (0.16 mol) of 1,3-dihydrogentetramethyldisiloxane (commercially available under the name "HSi2" from Wacker-Chemie GmbH D-8000 Munich) are treated with 20 g of Amberlyst XN-1010 ion exchanger in anhydrous form (commercially available from Aldrich-Chemie GmbH & Co. KG, D-7924 Steinheim), and the mixture is slowly heated to 100° C. After cooling, the ion exchanger is removed by filtration.

The filtrate contains an equilibrate, from which the low-molecular-weight constituents are removed by incipient distillation at a temperature of 50° C. and a pressure of 13 hPa. The resultant residue (110.7 g) comprises an α,ω-dihydrogendimethyl(poly)siloxane mixture having an average chain length of 12 siloxane units. This α,ω-dihydrogendimethyl(poly)siloxane mixture can be employed directly in the process of this invention.

EXAMPLE 1

(a) Preparation of 1-(3-butenyl)-4-chloromethylbenzene

A solution containing 1.49 mol of allylmagnesium chloride (commercially available from Aldrich-Chemie GmbH & Co. KG, D-7924 Steinheim) in 2000 ml of tetrahydrofuran is slowly added dropwise at a temperature of around 15° C. to a solution containing 332.6 g (1.90 mol) of 1,4-bis(chloromethyl)benzene (commercially available under the name α,α'-dichloro-p-xylene from Aldrich-Chemie GmbH & Co. KG, D-7924 Steinheim) in 1000 ml of anhydrous tetrahydrofuran. After working up the solution, and crystallization of unreacted 1,4-bis(chloromethyl)benzene from heptane, 234.2 g of a product remain, which contains, according to gas chromatography, 83% of 1-(3-butenyl)-4-chloromethylbenzene, 11% of 1,4-bis(3-butenyl)benzene and an additional 6% of 1,4-bis(chloromethyl)benzene.

The resultant 1-(3-butenyl)-4-chloromethylbenzene exhibits, in the 200 MHz $^1$H-NMR spectrum in CDCl$_3$ using TMS as the internal standard, signals at 2.35 (dt, J=7 and 7 Hz, 2H, —CH$_2$—CH=CH$_2$), 2.70 (t, J=7 Hz, 2H, Ar—CH$_2$—CH$_2$—CH=CH$_2$), 4.55 (s, 2H, Ar—CH$_2$—Cl), 4.98 (dd, J=10 and 2 Hz, 1H, —CH=CH$_a$H$_b$), 5.04 (dd, J=16 and 2 Hz, 1H, —CH=CH$_a$H$_b$), 5.84 (ddt, J=16, 10 and 7 Hz, 1H, —CH=CH$_2$) and 7.24 (AA'BB' spectrum; 4H, —Ar—) ppm, where Ar denotes an aromatic ring.

(b) Preparation of diethyl 4-(3-butenyl)benzyl phosphonate

About 281.4 g (83%, corresponding to 1.56 mol) of the 1-(3-butenyl)4-chloromethylbenzene described in (a) above, are slowly added dropwise at a temperature of 90° C. to 294 ml (1.71 mol) of triethyl phosphite (commercially available from Aldrich-Chemie GmbH & Co. KG, D-7924 Steinheim). This mixture is heated for 5 hours at a temperature of 150° C. and stirred at this temperature until the evolution of gas is complete. After distillation through a 15 cm Vigreux column, 325.9 of diethyl 4-(3-butenyl)benzylphosphonate are obtained as the main fraction, corresponding to a yield of 89%. The boiling point is between 125° and 132° C. at a pressure of 0.01 mm Hg.

The resultant diethyl 4-(3-butenyl)benzylphosphonate exhibits, in the 80 MHz $^1$H-NMR spectrum in CDCl$_3$, using TMS as the internal standard, signals at 1.23 (t, J=7 Hz; 6H, P(OCH$_2$—CH$_3$)$_2$), 2.30 (dt, J=6 and 7 Hz, 2H, H$_2$C=CH—CH$_2$—), 2.64 (t, J=7 Hz, 2H, Ar—CH$_2$—CH$_2$—), 3.08 (d, J=21 Hz, 2H, Ar—CH$_2$—P), 3.97 (dq, J=7 and 7 Hz, 4H, P(OCH$_2$—CH$_3$)$_2$), 4.93 (ddt, J=10, 2 and 2 Hz, 1H, H$_a$H$_b$C=CH—CH$_2$—), 4.96 (ddt, J=16, 2 and 2 Hz, 1H, H$_a$H$_b$C=CH—CH$_2$—) 5.79 (ddt, J=16, 10 and 6 Hz, 1H, H$_2$C=CH—CH$_2$—) and 7.12 (AA'BB' spectrum; 4H, —Ar—) ppm, where Ar represents an aromatic ring.

(c) Preparation of 1,4-bis(4-(3-butenyl)styryl)benzene

About 117.5 g (1.05 mmol) of the potassium tert-butylate (commercially available from Aldrich-Chemie GmbH & Co. KG, D-7924 Steinheim), 2.4 g (15 mol) of potassium iodide and 9.8 g (37 mmol) of 18-crown-6 in 1000 ml of toluene are introduced into a 4 liter three-neck flask, and a solution containing 59.1 g (0.44 mol) of terephthaldialdehyde (commercially available from Aldrich-Chemie GmbH & Co. KG, D-7924 Steinheim) and 249.0 g (0.88 mol) of the diethyl 4-(3-butenyl)benzylphosphonate described in (b) above in 500 ml of toluene are added dropwise with stirring and with salt-/ice cooling. The mixture is subsequently stirred for an additional 8 hours at room temperature. A yellow precipitate is formed which is filtered off with suction, washed with hot ethanol and dried, in vacuo, giving 172.2 g of yellow crystals, corresponding to a yield of 82%.

The resultant 1,4-bis(4-(3-butenyl)styryl)benzene exhibits, in the 200 MHz $^1$H-NMR spectrum in CDCl$_3$ using TMS as the internal standard, signals at 2.40 (dt, J=7 and 7 Hz, 4H, 2× H$_2$C=CH—CH$_2$—), 2.72 (t, J=7 Hz, 4H, 2× Ar—CH$_2$—CH$_2$—), 5.00 (ddt, J=10, 2 and 2 Hz, 2H, 2× H$_a$H$_b$C=CH—CH$_2$—), 5.06 (ddt, J=16 and 2 Hz, 2H, 2× H$_a$H$_b$C=CH—CH$_2$—) 5.87 (ddt, J=16, 10 and 7 Hz, 2H, 2× H$_2$C=CH—CH$_2$—), 7.08 (m, narrow, 4H,—Ar—CH=CH—Ar—), 7.31 (AA'BB' spectrum; 8H, 2× —H$_2$C—Ar—CH=) and 7.48 (m, narrow, 4H, 2× =HC—Ar—CH=) ppm, where Ar represents an aromatic ring.

The infra-red spectrum (KBr disc), exhibits significant bands at 1640 (m), 1520 (m), 1450 (m), 1420 (m), 995 (m), 970 (s), 910 (s) and 550 (s) cm$^{-1}$ and in the UV spectrum, using CH$_2$Cl$_2$ as solvent λ$_{max}$ (1 g ε)=361 nm, (5.68).

(d) Preparation of dicyclopentadienylplatinum dichloride

Dicyclopentadienylplatinum dichloride (dicpPtCl$_2$) as in U.S. Pat. No. 4,276,252 (G. Kreis, Wacker-Chemie GmbH; published on Jun. 30, 1981) is prepared by methods which are known from the literature (J. Chatt, L. M. Vallarino, L. M. Venanzi, J. Chem. Soc. (London) (1957) 2496-505, and H. C. Clark, L. E. Manzer, J. Organometal, Chem. 59 (1973) 411-28). About 7.00 g (0.0169 mol) of K$_2$PtCl$_4$ are dissolved in 120 ml of water, and 90 ml of n-propanol, 11.50 g (0.0870 mol) of dicyclopentadiene and 60 mg of anhydrous SnCl$_2$ are added. The bulky precipitate which precipitates after stirring for two days at room temperature is filtered off and washed with water, a little ethanol and then n-hexane. The precipitate is dissolved in dichloromethane and subsequently precipitated at a temperature of −80° C. by addition of n-hexane. Filtration and drying give 5.70 g (0.0143 mol) of dicpPtCl$_2$ as a pale powder which, according to the elemental analysis, contains 49.0% by weight of platinum. The yield, based on elemental platinum, is 85%.

About 15.3 g (39.2 mmol) of the 1,4-bis(4(3-butenyl)-styryl)-benzene described in (c) above, and 18.3 g (39.2 mmol) of the α,w-dihydrogendodecamethylhexasiloxane described in (A) above are heated to a temperature of 100° C. in 1200 ml of toluene with stirring and under an argon atmosphere. About 1.54 ml of a 1.27 10⁻³ molar solution of dicyclopentadienylplatinum dichloride, the preparation of which is described in (d) above, in chloroform are then added dropwise, and the mixture is refluxed for about one hour at 110° C. The resultant mixture is cooled and reduced to half the original volume in vacuo. The remainder of the solution is poured into 2.5 liters of ethanol with stirring, whereupon the poly(arylenevinylenesiloxane) of this invention precipitates. The precipitate is filtered off with suction and dried at a temperature of 70° C. under pressure of 10 mm Hg yielding 25.8 g of a yellow-green powder, which corresponds to a yield of 80%, having an average molecular weight (weight average) $M_w$ of 25,000, a weight average $M_w$: number average $M_n$ ratio of 2.38, an average degree of polymerization $P_w$ of 30 and having the following recurring units:

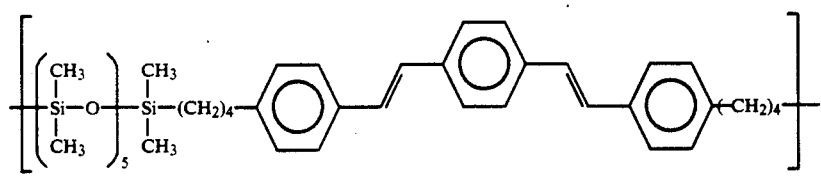

The poly(arylenevinylenesiloxanes) has an intrinsic viscosity of 0.28 dl/g, a glass transition point Tg of 105° C., a decomposition temperature of 350° C. under air and of 405° C. under nitrogen, and a smectic C layer structure below the clear point at 136° C., the interlayer separation being 2.9 nm.

The poly(arylenevinylenesiloxane) of this invention exhibits, in the 200 MHz ¹H-NMR spectrum in CDCl₃ using TMS as the internal standard, signals at 0.04 (s, 12H, —CH₂— Si(CH₃—)₂—O—, 0.08 (2s, 24H, —O— Si(CH₃)₂—O—), 0.59 (m, —Si—CH₂—), 1.40 (m, 4H, —Si—CH₂—CH₂—), 1.65 (tt, J=7 and 7 Hz, 4H, —Si—CH₂—CH₂—CH₂—), 2.62 (t, J=7 Hz, 4H, —CH₂—Ar—), 7.09 (s, 4H, —Ar—CH=CH—Ar—CH=CH—Ar—), 7.31 (AA'BB' spectrum; 8H, 2× —CH₂—Ar—CH=) and 7.49 (s, 4H, =HC—Ar—CH=) ppm, where Ar represents an aromatic ring.

The infra-red spectrum (KBr disc), exhibits significant bands at 3020 (w), 2960 (m), 2920 (m), 2855 (w), 2130 (w), 1520 (m), 1420 (m), 1260 (s), 1100–1000 (s), 965 (m), 910 (w), 840 (s), 800 (s), 700 (w) and 545 (m) cm⁻¹ and in the UV spectrum, with tetrahydrofuran as the solvent, λmax (1 gε)=323 nm, (4.48).

EXAMPLE 2

(a) Preparation of tetraethyl benzene-1,4-bis(methylenephosphonate)

About 205.6 ml of triethyl phosphite (commercially available from Aldrich-Chemie GmbH & Co. KG, D-7924 Steinheim) are added dropwise at 110° C. to a melt of 100 g (0.57 mol) of 1,4-bis(chloromethyl)benzene (commercially available from Aldrich-Chemie GmbH & Co. KG, D-7924 Steinheim). The mixture is stirred at 130° to 150° C. for 14 hours, and the solution, at 80°-100° C., is poured into n-heptane. The white crystals which precipitate are filtered off with suction and dried at 30° C. in vacuo, giving 205.6 g of a white powder, which corresponds to a yield of 95%.

The resultant tetraethyl benzene-1,4-bis(methylenephosphonate) exhibits, in the 200 MHz ¹H-NMR spectrum in CDCl₃ using TMS as the internal standard, signals at 1.23 (t, J=7 Hz, 12H, 4× —CH₃), 3.13 (d, J=20 Hz, 4H, 2× Ar—CH₂—P), 4.00 (dq. J=7 and; 7 Hz, 8H, 2× P(OCH₂CH₃)₂) and 7.25 (s, —Ar—) ppm, where Ar represents an aromatic ring.

(b) Preparation of 4-Allyloxy-3-methoxybenzaldehyde

About 388.2 g (2.0 mol) of vanillin (commercially available from Aldrich-Chemie GmbH & Co. KG, D-7924 Steinheim) and 80 g (2.0 mol) of NaOH are stirred for 20 minutes at 60° C. in 740 ml of water. About 168 ml (2.0 mol) of allyl chloride are then slowly added dropwise at 60° to 70° C. The mixture is refluxed for an additional 12 hours at 100° C. During this time, additional 40 g (1 mol) of NaOH, dissolved in 180 ml of water, and 84 ml (1 mol) of the allyl chloride described above, are added dropwise in 2 portions at a rate such that the pH of the reaction mixture always remains above 7.

The organic phase is separated off, and the aqueous phase is extracted three times with tert-butyl methyl ether (commercially available under the name "Diveron S" from Chemische Werke Huls AG, D-4370 Marl). The combined organic phases are washed until neutral and dried over sodium sulfate and the solvent is stripped off in vacuo. Distillation of the residue in vacuo gives 377.5 g of a colorless oil, which corresponds to a yield of 98%. The boiling point is between 112° and 115° C. at a pressure of 0.1 mm Hg.

The resultant 4-allyloxy-3-methoxybenzaldehyde exhibits, in the 200 MHz ¹H-NMR spectrum in CDCl₃ using TMS as the internal standard, signals at 3.92 (s, 3H, —OCH₃), 4.71 (d, J=6 Hz, 2H, —O—CH₂—), 5.35 (dd, J=10; 2 Hz, 1H, H$_a$H$_b$C=CH—CH₂—), 5.46 (dd, J=16; 2 Hz, 1H, H$_a$H$_b$C=CH—CH₂—), 6.10 (ddd, J=16, 10 and 6 Hz, 1H, H₂C=CH—CH₂—), 6.98 (d, J=8 Hz, 1H, 5-H), 7.41 (d, J=1 Hz, 1H, 2-H) and 7.42 (dd, J=8 Hz, 1H, 6-H) ppm.

(c) Preparation of 1,4-bis-(4-allyloxy-3-methoxystyryl)benzene

About 89.1 g (0.44 mol) of the 4-allyloxy-3-methoxybenzaldehyde described in (b) above, and 83.2 g (0.22 mol) of the tetraethylbenzene-1,4-bis(methylenephosphonate) described in (a) above, dissolved in 500 ml of toluene, are added dropwise over a period of three hours to a mixture containing 61.7 g (0.55 mol) of potassium tert-butylate, 4.8 g (18.3 mmol) of 18-crown-6, 1.14 g (6.9 mmol) of potassium iodide and 1000 mol of toluene at a temperature of between 0° and 10° C. The mixture is subsequently stirred at room temperature for an additional 16 hours. The resultant precipitate is filtered off with suction, washed with water and ethanol and dried at 70° C. at a pressure of 10 mm Hg, yielding 87.1 g of orange crystals having a melting point of 223° C. (toluene), which corresponds to a yield of 87%.

average: number average $M_n$ ratio of 2.36 and an average degree of polymerization of 45.3, and having the following recurring unit:

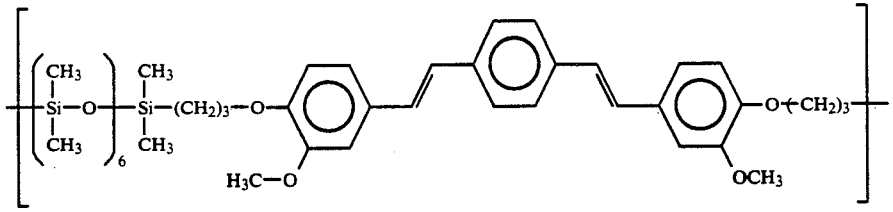

The resultant 1,4-bis-(4-allyloxy-3-methoxystyryl)-benzene exhibits, in the 200 MHz $^1$H-NMR spectrum in CDCl$_3$ using TMS as the internal standard, signals at 3.94 (s, 6H, 2 CH$_3$—O—), 4.65 (d, J=5 Hz, 4H, 2 H$_2$C=CH—CH$_2$—O—), 5.31 (dd, J=10; 2 Hz, 2H, H$_a$H$_b$C=CH—CH$_2$—), 5.43 (dd, J=16 and 2 Hz, 2H, H$_a$H$_b$C=CH—CH$_2$—), 6.10 (ddd, J=16, 10 and 5 Hz, 2H, H$_a$H$_b$C=CH—CH$_2$—), 6.87 (d, J=8 Hz, 2H, H$^5$), 6.98 (d, J=16 Hz, 2H, H$^2$ or H$^{2'}$), 7.03 (dd, J=8; 2 Hz, 2H, H$^4$), 7.05 (d, J=16 Hz, 2H, H$^{2'}$ or H$^2$), 7.08 (d, J=2 Hz, 2H, H$^3$) and 7.48 (s, 4H, H$^1$) ppm, having the following structural unit:

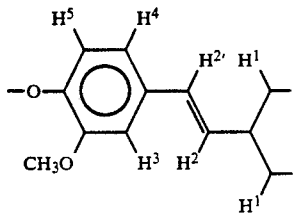

The resultant 1,4-bis(4-allyloxy-3-methoxystyryl)benzene exhibits, in the infra-red spectrum (KBr disc), significant bands at 1650 (w), 1630 (W), 1596 (m), 1580 (m), 1520 (s), 1425 (s), 1280 (s) 1250 (s), 1230 (s), 1135 (s), 1010 (s) and 970 (s) cm$^{-1}$, and in the UV spectrum, with CH$_2$Cl$_2$ as solvent, $\lambda_{max}$ (1 g $\epsilon$)=373 nm (5.82).

About 5.0 g (11 mmol) of the 1,4-bis(4-allyloxy-3-methoxystyryl)benzene prepared in (c) above, and 3.35 g (5.75 mmol) of 87% α,w-dihydrogentetradecamethylheptasiloxane, the preparation of which is described in (a) above, are heated to 110° C. in 100 ml of toluene, and 0.6 ml of a 1.27·10$^{-3}$ molar solution of dicyclopentadienylplatinum dichloride, the preparation of which is described in Example 1 (d) above, in trichloromethane is added. An additional 3.35 g of the α,w-dihydrogentetradecamethylheptasiloxane described above, mixed with 0.6 ml of the dicyclopentadienylplatinum dichloride solution described above, are added dropwise over a period of two hours, and, when the addition is complete, the mixture is refluxed for 1 hour at 110° C. The platinum residues are separated off by filtering the resultant mixture with suction through a 5 cm silica gel layer (commercially available under the name Silica Gel 60, E. Merck, D-6100 Darmstadt), and concentrating the filtrate in vacuo. The remaining solution is poured into 300 ml of ethanol with stirring, and the poly(arylenevinylenesiloxane) of this invention precipitates. The precipitate is filtered off with suction and dried at a temperature of 70° C. under a pressure of 10 mm Hg, yielding 8.5 g of a yellow-green powder which corresponds to a yield of 81%, having an average molecular weight (weight average) $M_w$ of 43,500, a weight The poly(arylenevinylenesiloxane) of this invention has an intrinsic viscosity of 0.50 dl/g, a glass transition point $T_g$ of 8° C., a decomposition temperature of 365° C. under air and of 385° C. under nitrogen, and a smectic C layer structure below the clear point of 38° C., the interlayer separation being 3.6 nm.

The poly(arylenevinylenesiloxane) of this invention, exhibits, in the 200 MHz $^1$H-NMR spectrum in CDCl$_3$ using TMS as the internal standard, signals at 0.13 (m, 42H, 14× Si—CH$_3$), 0.68 (m, 4H, Si—CH$_2$—), 1.92 (m, 4H, Si—CH$_2$—CH$_2$—), 3.96 (s, 6H, 2× —OCH$_3$), 4.03 (t, J=7 Hz, 4H, Si—CH$_2$—CH$_2$—CH$_2$—O—), 6.88 (d, J=8 Hz, 2H, H$^5$), 7.00 (d, J=16 Hz, 2H, H$^2$ or H$^{2'}$), 7.04 (dd, J=8; 2 Hz, 2H, H$^4$), 7.06 (d, J=16 Hz, 2H, H$^2$ or H$^{2'}$), 7.10 (d, J=2 Hz, 2H, H$^3$) and 7.49 (s, 4H, H$^1$) ppm, yielding the following structural unit:

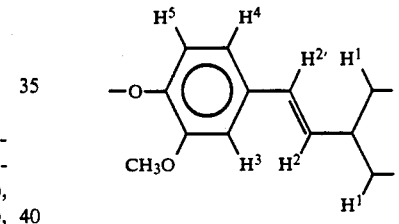

The infra-red spectrum (film) exhibits significant bands at 1600 (m), 1580 (m), 1515 (s), 1465 (m), 1450 (m), 1420 (m), 1258 (s), 1080 (s), 1025 (s), 960 (m), 917 (m) and 800 (s) cm$^{-1}$, and, in the UV spectrum, with tetrahydrofuran as solvent, max (1 g)=351 nm (4.52).

EXAMPLE 3

(a) Preparation of 1-(3-butenyl)-4-chlorobenzene

About 119.6 ml (1.45 mol) of allyl chloride, dissolved in 500 ml of anhydrous tetrahydrofuran, are added dropwise with vigorous stirring over a period of 4 hours to 85.1 g (3.5 mol) of magnesium turnings in 1.0 liter of anhydrous tetrahydrofuran. The organomagnesium compound is subsequently introduced into a dropping funnel and added dropwise, with ice cooling, to a solution containing 198.1 g (1.20 mol) of 4-chlorobenzyl chloride in 400 ml of anhydrous tetrahydrofuran. Customary work-up gives 197.7 g of a colorless oil, which corresponds to a yield of 98%. According to analysis by gas chromatography, the degree of purity is 99%.

The 1-(3-butenyl)-4-chlorobenzene thus obtained exhibits, in the 200 MHz $^1$H-NMR spectrum in CDCl$_3$ using TMS as the internal standard, signals at 2.33 (dt, J=7 and 7 Hz, 2H, H$_2$C=CH$_2$—CH—), 2.67 (t, J=7 Hz, 2H, —Ar—CH$_2$—), 4.98 (dd, J=10 and 2 Hz, 1H, H$_a$H$_b$C=CH—CH$_2$—), 5.01 (dd, J=16 and 2 HZ, 1H, H$_a$H$_b$C=CH—CH$_2$—), 5.82 (ddt, J=16, 10 and 7 Hz, 1H, H₂C=CH—CH₂—) and 7.17 (AA'BB' spectrum; 4H, —Ar—) ppm, where Ar represents an aromatic ring.

(b) Preparation of 4-(3-butenyl)benzaldehyde

A solution containing 50 g (0.30 mol) of the 1-(3-butenyl)-4-chlorobenzene described in (a) above in 50 ml of anhydrous tetrahydrofuran is added dropwise at 65° C. over a period of 2.5 hours to 10.9 g (0.45 mol) of iodine-etched magnesium turnings in 50 ml of anhydrous tetrahydrofuran after 0.5 ml of ethyl bromide had been added. The mixture is then stirred at 70° C. for an additional 4.5 hours. The resultant solution is decanted off from the excess magnesium, transferred into a dropping funnel and added dropwise at 0° to 5° C. to a solution containing 29 ml (0.375 mol) of N,N-dimethylformamide in 450 ml of anhydrous tetrahydrofuran. Customary work-up gives 43.3 g of a colorless oil, which corresponds to a yield of 90%. According to analysis by gas chromatography, the degree of purity is 83%. Distillation over a 30 cm packed column gives 30.3 g of a colorless oil with a boiling point of between 99° and 100° C. at a pressure of 2.25 mm Hg.

The 4-(3-butenyl)benzaldehyde thus obtained exhibits, in the 200 MHz ¹H-NMR spectrum in CDCl₂ using TMS as the internal standard, signals at 2.38 (dt, J=7 and 7 Hz, 2H, H₂C=CH—CH₂—), 2.76 (t, J=7 Hz, 2H, —Ar—CH₂—), 4.99 (dd, J=10 and 2 Hz, 1H, H$_a$H$_b$C=CH—CH₂—), 5.03 (dd, J=16 and 2 Hz, 1H, H$_a$H$_b$C=CH—CH₂—), 5.82 (ddt, J=16, 10 and 7 Hz, 1H, H₂C=CH—CH₂—) and 7.54 (AA'BB' spectrum; 4H, —Ar—) ppm, where Ar represents an aromatic ring.

(c) Preparation of diethyl 4-chlorobenzylphosphonate

About 645 g (4 mol) of 4-chlorobenzyl chloride are slowly added dropwise to 700 ml (4 mol) of triethyl phosphite at 135° C. with stirring, the resultant chloroethane is condensed in a cooled flask. When the addition of the 4-chlorobenzyl chloride is complete, the mixture is heated at 140° C. for a period of 5 hours and then subjected to fractional distillation in an oil-pump vacuum, giving 843 g of a colorless oil, which corresponds to a yield of 80%. The boiling point is 155° C. at a pressure of 0.7 mm Hg.

The diethyl 4-chlorobenzylphosphonate obtained in this way exhibits, in the 200 MHz ¹H-NMR spectrum in CDCl₃ using TMS as the internal standard, signals at 1.25 (t, J=7 Hz, 6H, 2× —CH₃), 3.08 (d, J=22 Hz, 2H, P—CH₂—Ar), 4.00 (dq, J=7 and 7 Hz, 4H, 2× P—O—CH₂—CH₃) and 7.21 (m, narrow; 4H, —Ar—) ppm, where Ar represents an aromatic ring.

Preparation of tetraethyl biphenyl-4,4'-bis-(methylenephosphonate)

Using a procedure analogous to that of J. Colon and D. R. Kelsey, J. Org. Chem. 51 (1986) 2627, 327 g (5.0 mol) of zinc granules (30 mesh), 38.6 g (0.188 mol) of sodium bromide, 16.2 g (0.125 mol) of nickel chloride, 320 g (1.25 mol) of triphenylphosphine and 7.03 g (0.62 mol) of 2,2'-bipyridyl are heated at 60° C. for 2 hours in 1200 ml of anhydrous N,N-dimethylformamide. The reaction mixture changes to a red-brown color. About 656.5 g (2.5 mol) of the diethyl 4-chlorobenzylphosphonate described in (c) above, dissolved in 250 ml of N,N-dimethylformamide, are then added dropwise at 60°-90° C. over a period of 2 hours, and the mixture is subsequently stirred at 80° C. for 2 hours. After cooling, the resultant solution is filtered through a 2 cm Tonsil layer (commercially available from Sud-Chemie AG, D-8000 Munich) and the filtrate is evaporated in vacuo. The residue is taken up in 1 liter of toluene, extracted for one hour with 3% hydrochloric acid and then washed with water until neutral. Drying over Na₂SO₄, cooling and suction filtration give 318.3 g of white crystals, which corresponds to a yield of 56%. The melting point is 112° C.

The resultant tetraethyl biphenyl-4,4'-bis(methylenephosphonate) exhibits, in the 200 MHz ¹H-NMR spectrum in CDCl₃ using TMS as the internal standard, signals at 1.25 (t, J=7 Hz, 12H, 4× —CH₃), 3.20 (d, J=22 Hz, 4H, 2× P—CH₂—Ar—), 4.05 (dq, J=7 and 7 Hz, 8H, 4× P—O—CH₂—CH₃), 7.38 (dd, J=8 and 2 Hz, 4H, Ar—3,3',5,5'-H) and 7.56 (d, J=8 Hz, 4H, Ar—2,2',6,6'-H) ppm, where Ar represents an aromatic ring.

(e) Preparation of 4,4'-bis(4-(3-butenyl)styryl)biphenyl

A solution containing 36.5 g (79 mmol) of the tetraethyl biphenyl-4,4'-bis(methylenephosphonate) described in (d) above and 25.8 g (159 mmol) of the 4-(3-butenyl)benzaldehyde described in (b) above in 400 ml of anisole is added dropwise with stirring and at a temperature of 10° to 20° C. to a suspension containing 19 g (167 mmol) of potassium tert-butylate and a spatula tip of 18-crown-6 in 200 ml of anisole, and the mixture is subsequently stirred at 50° C. for one hour. The mixture is cooled to room temperature, and the resultant solid is filtered off with suction, washed with water and tert-butyl methyl ether and dried at 70° C. in vacuo, giving 24.6 g of a yellow powder, which corresponds to a yield of 66%. The melting point, which is also the decomposition point, is 320° C.

The 4,4'-bis(4-(3-butenyl)styryl)biphenyl thus obtained exhibits, in the 200 MHz 1H-NMR spectrum in CDCl₃ using TMS as the internal standard, signals at 2.39 (dt, J=6 and 7 Hz, 4H, 2× =CH—CH₂—CH₂—), 2.73 (t, J=7 Hz, 4H, 2× —Ar—CH₂—), 5.00 (dd, J=10 and 2 Hz, 2H, 2× H$_a$H$_b$C=CH—CH₂—), 5.06 (dd, J=16 Hz, 2H, 2× H$_a$H$_b$C=CH—CH₂—), 5.88 (ddd, J=16, 10 and 6 Hz, 2H, 2× H₂C=CH—CH₂), 7.15 (s, 4H, 2× Ar—CH=CH— Ar), 7.34 (AA'BB' spectrum; 8H, 2× —CH₂—Ar—CH=) and 7.62 (AA'BB' spectrum; 8H, —Ar—Ar—) ppm, in which Ar represents an aromatic ring.

About 4.8 g (10 mmol) of the 4,4'-bis(4-(3-butenyl) styryl)-biphenyl described in (e) above and 7.0 g (10 mmol) of the α,w-dihydrogeneicosamethyldecasiloxane described in (A) above are heated to a temperature of 110° C. with stirring in 100 ml of toluene, 0.08 ml of a 1.27·10⁻³ molar solution of dicyclopentadienylplatinum dichloride, the preparation of which is described in Example 1 (d) above, in chloroform is then added, and the mixture is then refluxed for about 2 hours at 110° C. After cooling, the resultant mixture is filtered with suction through a 5 cm silica gel layer (commercially available under the name Silica Gel 60, E. Merck, D-6100 Darmstadt in order to remove the platinum residues, and then concentrated in vacuo to a volume of 50 ml. The solution which remains is poured into 250 ml of ethanol with stirring, the poly(arylenevinylenesiloxane) of this invention precipitating. The precipitate is filtered off with suction and dried at a temperature of 70° C. and a pressure of 10 mm Hg, giving 7.6 g of a yellow powder, which corresponds to a yield of 64%, having an average molecular weight (weight average) M$_w$ of 32,040, a weight average $M_w$: number average $M_n$ ratio of 3.09 and an average degree of polymerization $P_w$ of 26.8, and containing the following recurring unit

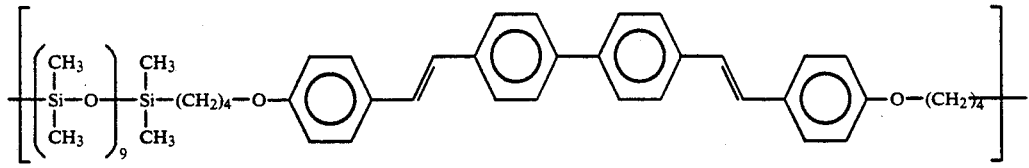

The poly(arylenevinylenesiloxane) of this invention has an intrinsic viscosity of 0.49 dl/g, a glass transition point $T_g$ of −54° C., a decomposition temperature of 370° C. under air and of 405° C. under nitrogen, and a smectic C layer structure below the clear point of 177° C., the interlayer separation being 4.4 nm.

The poly(arylenevinylenesiloxane) of this invention exhibits, in the 200 MHz $^1$H-NMR spectrum in CDCl$_3$ using TMS as the internal standard, signals at 0.13 (m, 60H, 20× Si—CH$_3$), 0.65 (m, 4H, 2×Si—CH$_2$), 1.45 (tt, J=7 and 7 Hz, 4H, 2× Si—CH$_2$—C$\underline{H}_2$—), 1.71 (tt, J=8 and 8 Hz, 4H, 2× Si—CH$_2$—CH$_2$—C$\underline{H}_2$—), 2.67 (t, J=7 Hz, 4H, 2× Si—CH$_2$—CH$_2$—C$\underline{H}_2$—CH$_2$—Ar), 7.18 (s, 4H, 2× —CH=CH—), 7.36 (AA'BB' spectrum; 8H, —CH$_2$—Ar—CH=) and 7.65 (AA'BB' spectrum; 8H,—Ar—Ar—) ppm, in which Ar represents an aromatic ring.

In the infra-red spectrum (KBr disc), significant bands are shown at 1512 (w), 1493 (w), 1415 (w), 1260 (s), 1095 (s), 1025 (s) and 800 (s) cm$^{-1}$, and in the UV spectrum, in tetrahydrofuran as solvent, $\lambda_{max}$ (1 g $\epsilon$)=350 nm (4.63).

EXAMPLE 4

(a) Preparation of 4,4'-bis(4-allyloxy-3-methoxystyryl)biphenyl

A solution containing 101 g (0.22 mol) of the tetraethyl biphenyl-4,4'-bis(methylenephosphonate) described in Example 3 in (d) above and 92.6 g (0.44 mol) of the 4-allyloxy- 3-methoxybenzaldehyde described in Example 2 (b) above, in 600 ml of anisole, is added dropwise with stirring and at a temperature of 10° to 20° C. to a suspension containing 56 g (0.49 mol) of potassium tert-butylate and a spatula tip of 18-crown-6 in 1500 ml of anisole, and the mixture is then stirred at 50° C. for 1 hour. The mixture is cooled to room temperature, and the resultant solid is filtered off with suction, washed with water in tert-butyl methyl ether and dried at 70° C. in vacuo, giving 84.7 g of a yellow powder having a melting point of 250° C. (N,N-dimethylformamide), which corresponds to a yield of 73%.

The resultant 4,4'-bis(4-allyloxy-3-methoxystyryl)-biphenyl exhibits, in the 200 MHz $^1$H-NMR spectrum in CDCl$_3$ using TMS as the internal standard, signals at 3.95 (s, 6H, —OCH$_3$), 4.66 (d, J=6 Hz, 4H, —A-r—O—CH$_2$—), 5.31 (dd, J=10 and 2 Hz, 2H, 2× H$_a$H$_b$C=CH—CH$_2$—), 5.42 (dd, J=16 and 2 Hz, 2H, 2× $\underline{H}_a$H$_b$C=CH—CH$_2$), 6.12 (ddd, J=16, 10 and 6 Hz, 2H, 2× H$_2$C=CH—CH$_2$—), 6.89 (d, J=8 Hz, H$^5$), 7.01 (d, J=16 Hz, 2H, H$^2$ or H$^{2'}$), 7.06 (dd, J=8 and 2 Hz, 2H, H$^4$), 7.10 (d, J=16 Hz, 2H, H$^{2'}$ or H$^2$), 7.10 (d, J=2 Hz, 2H, H$^3$) and 7.61 (AA'BB' spectrum; 8H, —Ar—Ar—) ppm, where Ar represents an aromatic ring, having the following structural unit

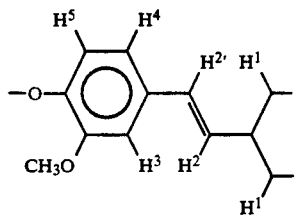

About 10.6 g (20 mmol) of the 4,4'-bis(4-allyloxy-3-methoxystyryl)biphenyl described in (a) above, and 15.5 g (20 mmol) of the α,ω-dihydrogeneicosamethyl-decasiloxane described in (A) above, are heated to 120° C. in 120 ml of anisole with stirring and under an argon atmosphere, and 0.8 mg (2·10$^{-6}$ mol) of the dicyclopentadienylplatinum dichloride described in Example 1 (d) above, is then added, and the mixture is then heated at 150 C for about 3 hours. After cooling, the resultant mixture is filtered through a 5 cm silica gel layer (commercially available under the name Silica Gel 60, E. Merck, D-6100 Darmstadt) in order to remove the platinum residues. The filtrate is reduced in vacuo, and 200 ml of petroleum ether are added. The resultant precipitate is filtered off, and the filtrate is evaporated to dryness in vacuo. This residue is mixed with 100 ml of petroleum ether, and the solution is then poured into 350 ml of ethanol. The precipitate which forms is filtered off with suction and dried at 70° C. in vacuo, giving 16.8 g of a yellow powder, which corresponds to a yield of 67%, having an average molecular weight (weight average) $M_w$ of 16,000, a weight average $M_w$: number average $M_n$ ratio of 1.88 and an average degree of polymerization $P_w$ of 12.7, and having the following recurring unit

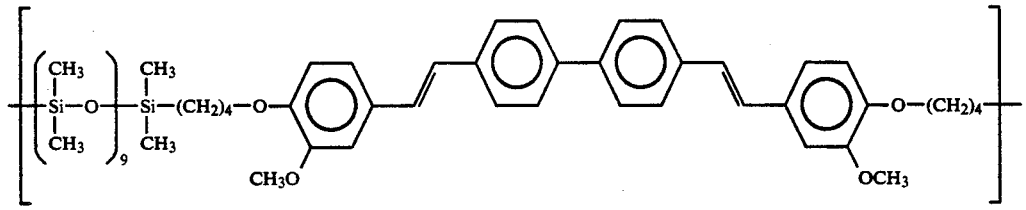

The poly(arylenevinylenesiloxane) of this invention has an intrinsic viscosity of 0.22 dl/g, a glass transition point $T_g$ of −3° C, a decomposition temperature of 345°

C. under air and of 380° C. under nitrogen, and a smectic C layer structure below the clear point of 194° C., the interlayer separation being 4.3 nm.

The poly(arylenevinylenesiloxane) of this invention exhibits, in the 200 MHz $^1$H-NMR spectrum in CDCl$_3$ using TMS as the internal standard signals at 0.13 (m 60H 20× Si—CH$_3$), 0.73 (m, 4H, 2× Si—CH$_2$), 1.97 (m, 4H, 2× Si—CH$_2$—CH$_2$—), 4.00 (s, 6H, 2× OCH$_3$), 4.08 (t, J=7 Hz, 4H, 2× $\overline{\text{Si}}$—CH$_2$—CH$_2$—CH$_2$—O—), 6.93 (d, J=8 Hz, 2H, H$^5$), 7.06 (d, J=16 Hz, $\overline{2\text{H}}$, H$^2$ or H$^{2'}$) 7.11 (dd, J=8 and 2 Hz, 2H, H$^4$), 7.15 (d, J=2 Hz, 2H, H$^3$), 7.17 (d, J=16 Hz, 2H, H$^{2'}$ or H$^2$) and 7.66 (AA'BB' spectrum; 8H, —Ar—Ar) ppm, where Ar represents an aromatic ring, having the following structural unit

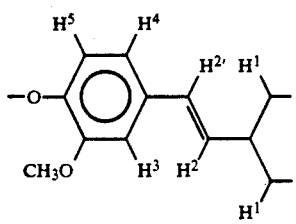

In the infra-red spectrum (KBr disc), significant bands are shown at 1595 (w), 1512 (m), 1465 (w), 1417 (W), 1260 (s), 1090 (s), 1025 (s) and 800 (s) cm$^{-1}$, and in the UV spectrum, in tetrahydrofuran as solvent, $\lambda_{max}$ (1 g $\epsilon$)=365 nm (5.79).

EXAMPLE 5

(a) Preparation of 4,4'-dimethyl-trans-stilbene

A solution containing 432 g (1.78 mol) of diethyl 4-methylbenzylphosphonate and 210 ml (1.78 mol) of tolualdehyde in 1 liter of toluene is added dropwise at 0° to 10° C. with stirring to a suspension containing 239.7 g (2.13 mol) of potassium tert-butylate, 16.2 g (61 mmol) of 18-crown-6 and 4.6 g (28 mmol) of potassium iodide in 2.5 liters of toluene. The crystals which are formed are filtered off with suction, washed with water and recrystallized from ethanol, giving 312.3 g of pale, needle-like crystals having a melting point of between 184 and 186° C., which corresponds to a yield of 85%.

The 4,4'-dimethyl-trans-stilbene thus obtained exhibits, in the 200 MHz $^1$H-NMR spectrum in CDCl$_3$ using TMS as the internal standard, signals at 2.35 (s, 6H, 2×—CH$_3$), 7.05 (s, 2H, —CH=CH—), 7.28 (AA'BB' spectrum; 8H, 2×—Ar—) ppm, where Ar represents an aromatic ring.

(b) Preparation of 4,4'-bis(bromomethyl)stilbene

About 162.8 g (0.78 mol) of the 4,4'-dimethylstilbene described in (a) above, 320 g (1.79 mol) of N-bromosuccinimide and 6.5 g of azobisisobutyronitrile were refluxed for 6 hours in 1.5 liters of tetrachloromethane. The solid thus obtained is filtered off with suction, washed with hot ethanol and dried in vacuo, giving 189.4 g of pale yellow crystals having a melting point of between 182° and 184° C., which corresponds to a yield of 60%.

The 4,4'-bis(bromomethyl)stilbene thus obtained exhibits, in the 200 MHz $^1$H-NMR spectrum in CDCl$_3$ using TMS as the internal standard, signals at 4.53 (s, 4H, 2x Ar—CH$_2$—Br), 7.11 (s, 2H, —CH=CH—) and 7.43 (AA'BB' spectrum; 8H, 2×—Ar—) ppm, where Ar represents an aromatic ring.

(c) Preparation of tetraethyl stilbene-4,4'-bis(methylenephosphonate)

By a method analogous to the procedure described in Example 2(a) above, 356.6 g (0.95 mol) of the 4,4'-bis(bromomethyl)stilbene described in (b) above, are reacted with 356.1 g (2.10 mol) of triethyl phosphite, giving 445.4 g of yellow crystals having a melting point of between 141° and 143° C., which corresponds to a yield of 97%.

The resultant tetraethyl stilbene-4,4'-bis(methylenephosphonate) exhibits, in the 200 MHz $^1$H-NMR spectrum in CDCl$_3$ using TMS as the internal standard, signals at 1.25 (t, J=7 Hz, 12H, 4×—CH$_3$), 3.18 (d, J=22 HZ; 4H, 2×—Ar—CH$_2$—P), 4.03 (dq, J=7; 7 Hz; 8H, 2× P(O—CH$_2$—CH$_3$)$_2$), 7.07 (s, 2H, —CH=CH—), 7.29 (dd, J=$\overline{8}$; 2 Hz, 4H, —Ar—, 2,2',5,5'-H) and 7.46 (d, J=8 Hz, 4H, —Ar—, 2,2',6,6'-H) ppm, where Ar represents an aromatic ring.

(d) Preparation of 4,4'-bis(4-allyloxy-3-methoxystyryl)stilbene

A solution containing 147.0 g (306 mmol) of the tetraethyl stilbene-4,4'-bis(methylenephosphonate) described in (c) above and 129.4 g (673 mmol) of the 4-allyloxy-3-methoxybenzaldehyde described in Example 2 (b) above in 900 ml of anisole, is added dropwise with stirring and at a temperature of 0° to 10° C. to a suspension containing 94.4 g (841 mmol) of potassium tert-butylate, 6.1 g (23 mmol) of 18-crown-6 and 1.75 g (10 mmol) of potassium iodide in 1300 ml of anisole. The mixture is then stirred at room temperature for an additional 1 hour and then at 110° C. for an additional 3 hours. The mixture is cooled to room temperature and the resultant solid is filtered off with suction and recrystallized first from dimethyl sulfoxide and then from veratrol (1,2-dimethoxybenzene), giving 119.5 g of yellow crystals, which corresponds to a yield of 73%.

The 4,4'-bis(4-allyloxy-3-methoxystyryl)stilbene thus obtained exhibits, in the 200 MHz $^1$H-NMR spectrum in a CDCl$_3$/DMSO-d6 (9:1) solvent mixture using TMS as the internal standard, signals at 3.95 (s, 6H, —OCH$_3$), 4.64 (d, J=6 Hz, 4H, —Ar—O—CH$_2$—), 5.31 ("d", J=10 Hz, 2H, 2× H$_a$ H$_b$C=CH—CH$_2$—), 5.44 ("d", J=16 Hz, 2H, H$_a$H$_b$C=$\overline{\text{CH}}$—CH$_2$—), 6.10 (ddd, J=16, 10 and 6 Hz, $\overline{2\text{H}}$, H$_2$C=$\overline{\text{CH}}$—CH$_2$—), 6.91 ("d", J=8 Hz, 2H, H$^5$), 7.01 (d, J=16 Hz, 2H, H$^2$ or H$^{2'}$), 7.12 (d, J=16 Hz, 2H, H$^{2'}$ or H$^2$), 7.13 ("d", J=8 Hz, 2H, H$^4$), 7.16 ("s", 2H, H$^3$), 7.16 ("s", 2H, —CH=CH—) and 7.54 (m, narrow, 8H, —$\overline{\text{Ar}}$—CH=CH—$\overline{\text{Ar}}$—) ppm, where Ar represents an aromatic ring, having the following structural unit:

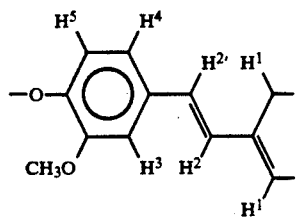

The resultant 4,4'-bis(4-allyloxy-3-methoxystyryl) stilbene exhibits, in the infra-red spectrum (KBr disc), significant bands at 1590 (w), 1517 (s), 1422 (w), 1283 (m), 1270 (m), 1250 (s), 1230 (m), 1135 (s) and 966 (m) cm$^{-1}$.

About 2.0 g (3.7 mmol) of the 4,4'-bis(4-allyloxy-3-methoxystyryl)stilbene prepared in (d) above, and 2.5 g (3.4 mmol) of α,w-dihydrogeneicosamethyldecasiloxane, the preparation of which is described in (A) above, are heated to 150° C. in 300 ml of anhydrous anisole, and 0.4 ml of a 1.27·10$^{-3}$ molar solution of dicyclopentadienylplatinum dichloride, the preparation of which is described in Example 1 (d) above, in trichloromethane is added. An additional 0.9 g (1.2 mmol) of the α,w-dihydrogeneicosamethyldecasiloxane described in detail above, is subsequently added dropwise over a period of 30 minutes, and, when the addition is complete, the mixture is refluxed for 3.5 hours at 154° C. After cooling to room temperature, the reaction solution is poured into 2000 ml of ethanol with stirring, the poly(arylenevinylenesiloxane) of this invention precipitating. The precipitate is filtered off with suction, reprecipitated from THF/methanol, filtered off with suction and dried at a temperature of 70° C. and a pressure of 10 mm Hg, giving 3.13 g of a yellow-green powder, which corresponds to a yield of 66%, having an average molecular weight (weight average) $M_w$ of 16,800, a weight average $M_w$: number average $M_n$ ratio of 1.93 and an average degree of polymerization of 13.3, and having the following recurring unit:

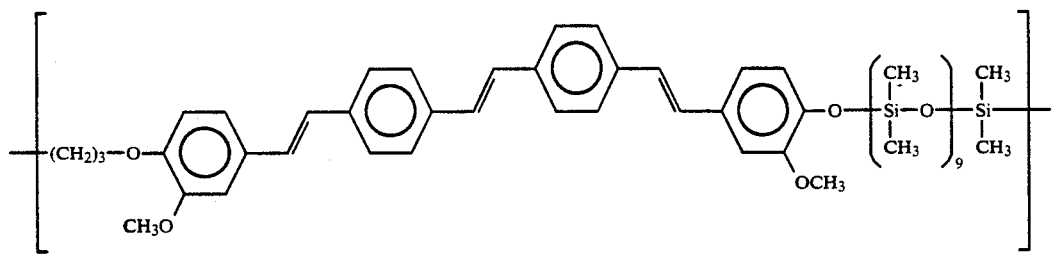

The poly(arylenevinylenesiloxane) of this invention has an intrinsic viscosity of 0.19 dl/g, two glass transition points at −94° and +14° C., a decomposition temperature of 352° C. under air and of 380° C. under nitrogen, and a smectic C layer structure below the clear point of 220° C., the interlayer separation being 4.4 nm.

The poly(arylenevinylenesiloxane) of this invention exhibits, in the 300 MHz $^1$H-NMR spectrum in CDCl$_3$ using TMS as the internal standard, signals at 0.08 (m, 60H, 20× Si—CH$_3$), 0.65 (m, 4H, 2× Si—CH$_2$—), 1.89 (m, 4H, 2× Si—CH$_2$—CH$_2$), 3.93 (s, 6H, 2× OCH$_3$), 3.99 (t, J=7 Hz, 4H, 2× Si—CH$_2$—CH$_2$—CH$_2$—O—), 6.83–7.45 (multiplets, 12H, (—O—)$_2$C$_6$H$_3$—CH=CH—, —CH=CH—) and 7.48 (m, narrow, 8H, —Ar—CH=CH—Ar—) ppm, where Ar represents an aromatic ring, and in the infra-red spectrum (KBr disc), significant bands are present at 1516 (m), 1260 (s), 1090 (s), 1025 (s) and 800 (s) cm$^{-1}$, and in the UV spectrum, in tetrahydrofuran as solvent, $\lambda_{max}$ (1 gε)=395 nm (4.91).

EXAMPLE 6

The procedure described in Example 1 is repeated, except that the α,w-dihydrogendodecamethylhexasiloxane is replaced with a siloxane prepared in accordance with procedure (A) above and has the formula

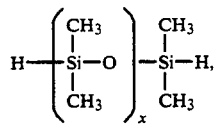

in which x in each case has the meaning shown in Table 1. Poly(arylenevinylenesiloxanes) are obtained with the yields, $M_w$, $M_w/M_n$, $P_w$, $T_g$, $T_i$ and d shown in Table 1.

TABLE 1

| Experiment | x | Yield (%) | $M_w$ | $M_w/M_n$ | $P_w$ | $T_g$ [°C.] | $T_i$ [°C.] | d [nm] |
|---|---|---|---|---|---|---|---|---|
| 6.1 | 4 | 82 | 16,400 | 1.94 | 22 | 108 | 148 | 2.9 |
| 6.2 | 7 | 66 | 17,300 | 2.25 | 18 | 56 | 109 | 3.0 |
| 6.3 | 8 | 71 | 25,000 | 2.08 | 24 | 70 | 124 | 3.2 |
| 6.4 | 11 | 60 | 57,400 | 3.24 | 45 | 80 | 112 | 4.1 |
| 6.5 | 19 | 54 | 35,000 | 2.13 | 19 | 25 | 64 | 5.0 |

EXAMPLE 7

The procedure described in Example 2 is repeated, except that the α,w-dihydrogentetradecamethylheptasiloxane is replaced by a siloxane of formula (IX) prepared in accordance with procedure (A), in which x in each case has the meaning given in Table 2. Poly(arylenevinylenesiloxanes) are obtained with the yields, $M_w$, $M_w/M_n$, $P_w$, $T_g$, $T_i$ and d given in Table 2.

TABLE 2

| Experiment | x | Yield (%) | $M_w$ | $M_w/M_n$ | $P_w$ | $T_g$ [°C.] | $T_i$ [°C.] | d [nm] |
|---|---|---|---|---|---|---|---|---|
| 7.1 | 3 | 65 | 10,000 | 1.90 | 13 | 42 | 64 | 2.8 |
| 7.2 | 5 | 55 | 12,800 | 1.79 | 14 | 40 | 98 | 2.9 |
| 7.3 | 9 | 79 | 62,500 | 1.98 | 53 | 50 | 69 | 3.7 |
| 7.4 | 11 | 70 | 52,400 | 1.71 | 39 | 14 | 73 | 3.8 |

EXAMPLE 8

The procedure described in Example 3 is repeated, except that the α,w-dihydrogeneicosamethyldecasiloxane is replaced by a siloxane of formula (IX) prepared in accordance with procedure (A), in which x in each case has the meaning given in Table 3. Poly(arylenevinylenesiloxanes) are obtained with the yields, $M_w$, $M_w/M_n$, $P_w$, $T_g$, $T_i$ and d given in Table 3.

TABLE 3

| Experiment | x | Yield (%) | $M_w$ | $M_w/M_n$ | $P_w$ | $T_g$ [°C.] | $T_i$ [°C.] | d [nm] |
|---|---|---|---|---|---|---|---|---|
| 8.1 | 6 | 50 | 8,300 | 1.71 | 9 | −91 | 236 | 4.1 |
| 8.2 | 8 | 59 | 20,600 | 2.12 | 21 | −90/14 | 263 | — |
| 8.3 | 11 | 27 | 48,100 | 3.99 | 36 | −66 | 200 | 4.6 |
| 8.4 | 19 | 26 | 34,200 | 2.45 | 18 | −113 | 144 | — |

EXAMPLE 9

The procedure described in Example 4 is repeated, except that the α,w-dihydrogeneicosamethyldecasiloxane is replaced by a siloxane of the formula (IX) prepared in accordance with procedure (A), in which x in each case has the meaning given in Table 4. Poly(arylenevinylenesiloxanes) are obtained with the yields, $M_w$, $M_w/M_n$, $P_w$, $T_g$, $T_i$ and d given in Table 4.

TABLE 4

| Experiment | x | Yield (%) | $M_w$ | $M_w/M_n$ | $P_w$ | $T_g$ [°C.] | $T_i$ [°C.] | d [nm] |
|---|---|---|---|---|---|---|---|---|
| 9.1 | 4 | 14 | 11,300 | 3.31 | 13 | 58 | 231 | 3.4 |
| 9.2 | 7 | 46 | 13,700 | 2.67 | 12 | −76/16 | 205 | 3.8 |
| 9.3 | 11 | 84 | 24,100 | 2.24 | 17 | −98/5 | 214 | 4.3 |
| 9.4 | 19 | 88 | 32,900 | 2.11 | 16 | −110 | 205 | — |

EXAMPLE 10

The procedure described in Example 1 is repeated, except the α,w-dihydrogendodecamethylhexasiloxane is replaced by an α,w-dihydrogendimethyl(poly)siloxane mixture prepared in accordance with procedure (B) having an average chain length of $x_m$ siloxane units, where $x_m$ in each case has the meaning given in Table 5. Poly(arylenevinylenesiloxanes) are obtained with the yields, $M_w$, $M_w/M_n$, $T_g$, $T_i$ and d given in Table 5.

TABLE 5

| Experiment | x | Yield (%) | $M_w$ | $M_w/M_n$ | $T_g$ [°C.] | $T_i$ [°C.] | d [nm] |
|---|---|---|---|---|---|---|---|
| 10.1 | 12 | 83 | 51,300 | 2.37 | −105/52 | 158 | 4.6 |
| 10.2 | 16 | 99 | 27,600 | 2.05 | −110/42 | 145 | 5.1 |
| 10.3 | 39 | 92 | 26,400 | 1.99 | −115/21 | ~50 | — |
| 10.4 | 52 | 91 | 27,000 | 2.63 | −117/−28 | 40 | — |
| 10.5 | 68 | 100 | 63,900 | 2.01 | −116/−46 | 90 | — |

What is claimed is:

1. A poly(arylenevinylenesilicon) compound selected from the group consisting of a poly(arylenevinylenesilane), a poly(arylenevinylenesiloxane) and a poly(arylenevinylenesilcarbane).

2. The poly(arylenevinylenesilicon) of claim 1, wherein the poly(arylenevinylenesiloxane) contains units of the formula

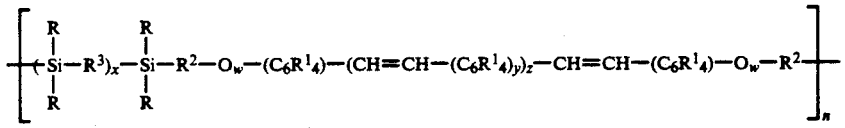

(I)

in which R is selected from the group consisting of a monovalent SiC-bonded organic radical free of aliphatic multiple bonds and a substituted monovalent SiC-bonded organic radical free of aliphatic multiple bonds, $R^1$ is selected from the group consisting of a hydrogen atom, halogen atom, nitro group, cyano group, a monovalent organic radical free of aliphatic multiple bonds and a substituted monovalent organic radical free of aliphatic multiple bonds, $R^2$ is selected from the group consisting of a divalent organic radical and a substituted divalent organic radical, $R^3$ is selected from the group consisting of an oxygen atom, a divalent SiC-bonded organic radical free of aliphatic multiple bonds and a substituted divalent, SiC-bonded organic radical free of aliphatic multiple bonds, n is a number of from 2 to 500, w is 0 or 1, x is a number of from 1 to 100, y is 1 or 2, and z is a number of from 1 to 3, with the proviso that y is 1 if z is greater than 1.

3. The poly(arylenevinylenesilicon) of claim 2, wherein $R^3$ is an oxygen atom.

4. The poly(arylenevinylenesilicon) of claim 1, wherein the vinyl groups are trans-configured.

5. The poly(arylenevinylenesilicon) of claim 2, wherein the vinyl groups are trans-configured.

6. A process for preparing the poly(arylenevinylenesilicon) of claim 1, which comprises reacting an α,w-dialkenylarylenevinylene with an organosilicon compound containing two Si-bonded hydrogen atoms, in the presence of a catalyst which promotes the addition reaction of Si-bonded hydrogen to an aliphatic multiple bond.

7. A process for preparing the poly(arylenevinylenesilicon) of claim 2, which comprises reacting an α,w-dialkenyllarylenevinylene of the formula

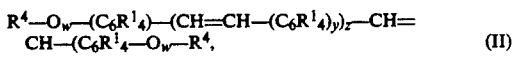

(II)

in which $R^1$ is selected from the group consisting of a hydrogen atom, halogen atom, nitro group, cyano group, a monovalent organic radical free of aliphatic multiple bonds and a substituted monovalent organic radical free of aliphatic multiple bonds, $R^4$ is selected from the group consisting of a monovalent organic radical containing a carbon-carbon double bond and a substituted monovalent organic radical containing a carbon-carbon double bond, w is 0 or 1, y is 1 or 2 and z is a number of from 1 to 3, with the proviso that y is 1 if z is greater than 1, with an organosilicon compound containing two Si-bonded hydrogen atoms and having the formula

(VIII)

in which R is selected from the group consisting of a monovalent SiC-bonded organic radical free of aliphatic multiple bonds and a substituted monovalent SiC-bonded organic radical free of aliphatic multiple bonds, $R^3$ is selected from the group consisting of an oxygen atom, a divalent SiC-bonded organic radical free of aliphatic multiple bonds and a substituted divalent SiC-bonded organic radical free of aliphatic multiple bonds, and x is a number of from 1 to 100, in the presence of a catalyst which promotes the addition reaction of Si-bonded hydrogen to an aliphatic multiple bond.

8. The process of claim 7, wherein $R^3$ is an oxygen atom.

9. A thermoset which is obtained by crosslinking the poly(arylenevinylenesilicon) of claim 1.

* * * * *